US011916536B2

(12) United States Patent
Takata

(10) Patent No.: US 11,916,536 B2
(45) Date of Patent: Feb. 27, 2024

(54) FILTER DEVICE AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 555 days.

(21) Appl. No.: 17/170,970

(22) Filed: Feb. 9, 2021

(65) Prior Publication Data
US 2021/0167750 A1 Jun. 3, 2021

Related U.S. Application Data

(63) Continuation of application No. PCT/JP2019/030797, filed on Aug. 6, 2019.

(30) Foreign Application Priority Data

Aug. 30, 2018 (JP) ................................. 2018-161255

(51) Int. Cl.
H03H 9/145 (2006.01)
H03H 9/64 (2006.01)
H03H 9/72 (2006.01)

(52) U.S. Cl.
CPC ...... H03H 9/14544 (2013.01); H03H 9/6483 (2013.01); H03H 9/72 (2013.01)

(58) Field of Classification Search
CPC .... H03H 9/14544; H03H 9/6483; H03H 9/72; H03H 9/6476; H03H 9/6433; H03H 9/14541; H03H 9/725
See application file for complete search history.

(56) References Cited

U.S. PATENT DOCUMENTS 10,250,230 B2 * 4/2019 Ono ........................ H03H 9/64
11,658,640 B2 * 5/2023 Koreeda ................. H03H 9/72
333/133

(Continued)

FOREIGN PATENT DOCUMENTS

JP 59-37723 A 3/1984
JP 2002-164763 A 6/2002

(Continued)

OTHER PUBLICATIONS

Official Communication issued in International Patent Application No. PCT/JP2019/030797, dated Oct. 21, 2019.

Primary Examiner — Andrea Lindgren Baltzell
Assistant Examiner — Kimberly E Glenn
(74) Attorney, Agent, or Firm — Keating & Bennett, LLP

(57) ABSTRACT

A filter device includes a filter between an input terminal and an output terminal, and an additional circuit connected in parallel with the filter between the input terminal and the output terminal. The additional circuit includes at least two longitudinally coupled resonators connected in parallel with each other and including longitudinally coupled resonators, and at least one capacitance element between the input terminal and the at least two longitudinally coupled resonators or between the output terminal and the at least two longitudinally coupled resonators. The average pitch of a plurality of electrode fingers of IDT electrodes of the longitudinally coupled resonator and the average pitch of a plurality of electrode fingers of IDT electrodes of the longitudinally coupled resonator are different from each other.

20 Claims, 11 Drawing Sheets

(56) References Cited

U.S. PATENT DOCUMENTS

| | | |
|---|---|---|
| 2002/0057035 A1 | 5/2002 | Nakamura et al. |
| 2012/0139662 A1 | 6/2012 | Fujiwara et al. |
| 2015/0171827 A1 | 6/2015 | Kawasaki |
| 2018/0069529 A1 | 3/2018 | Bi et al. |
| 2018/0131348 A1 | 5/2018 | Takahashi |
| 2019/0296716 A1 | 9/2019 | Araki |

FOREIGN PATENT DOCUMENTS

| | | |
|---|---|---|
| JP | 2006-121372 A | 5/2006 |
| JP | 2007-142703 A | 6/2007 |
| JP | 2013-070272 A | 4/2013 |
| JP | 2014-171210 A | 9/2014 |
| JP | 2018-038040 A | 3/2018 |
| JP | 2018-078489 A | 5/2018 |
| JP | 2019-169921 A | 10/2019 |
| WO | 2011/052218 A1 | 5/2011 |
| WO | 2014/034215 A1 | 3/2014 |

\* cited by examiner

FILTER DEVICE AND MULTIPLEXER

CROSS REFERENCE TO RELATED APPLICATIONS

This application claims the benefit of priority to Japanese Patent Application No. 2018-161255 filed on Aug. 30, 2018 and is a Continuation Application of PCT Application No. PCT/JP2019/030797 filed on Aug. 6, 2019. The entire contents of each application are hereby incorporated herein by reference.

BACKGROUND OF THE INVENTION

1. Field of the Invention

The present invention relates to a filter device and a multiplexer.

2. Description of the Related Art

In recent years, there has been a demand for CA (carrier aggregation) in which a plurality of filters are connected in common and signals in a plurality of frequency bands that respectively correspond to the plurality of filters are simultaneously transmitted and received. To perform CA, a multiplexer (multiplexer/demultiplexer) in which a plurality of filters are connected in common is used. At this time, to prevent leakage of a transmission signal into one filter among the plurality of filters, the transmission signal being in the passband of another filter connected in common to the one filter, it is necessary to improve the attenuation characteristics of the one filter in a frequency band corresponding to the passband of the other filter. For this, for example, Japanese Unexamined Patent Application Publication No. 2014-171210 discloses using an additional circuit generating a signal that has a phase opposite to the phase of and an amplitude the same as the amplitude of an unwanted signal, in the frequency band of the other filter, leaking into the one filter and that cancels the unwanted signal. When such an additional circuit is connected in parallel with the one filter, the attenuation characteristics of the one filter is improved. Accordingly, for example, the isolation characteristics among filters in a multiplexer that includes the filter is improved.

However, due to a recent demand for multiband- and wideband-communication frequencies, the number of filters connected in common in a multiplexer tends to increase, and it is necessary to improve the attenuation characteristics of the filters in a plurality of frequency bands. For this, it is necessary to generate a cancel signal for canceling an unwanted signal in each of the plurality of frequency bands, and specifically, it is necessary to adjust phases for the plurality of frequency bands. However, with the configuration disclosed in Japanese Unexamined Patent Application Publication No. 2014-171210 described above, it is difficult to adjust phases for the plurality of frequency bands. Specifically, it may be possible to generate a cancel signal in one frequency band among the plurality of frequency bands but it might not be possible to generate a cancel signal in another frequency band. Therefore, there is a problem that sufficient attenuation characteristics are not obtained in the plurality of frequency bands.

SUMMARY OF THE INVENTION

Preferred embodiments of the present invention provide filter devices in each of which the attenuation characteristics are able to be effectively improved.

A filter device according to a preferred embodiment of the present invention includes a first filter provided between an input terminal and an output terminal; and an additional circuit connected in parallel with the first filter between the input terminal and the output terminal. The additional circuit includes at least two IDT electrode groups connected in parallel with each other and including a first IDT electrode group and a second IDT electrode group, and at least one capacitance element provided between the input terminal and the at least two IDT electrode groups or one capacitance element provided between the output terminal and the at least two IDT electrode groups. The at least two IDT electrode groups each include a plurality of IDT (Interdigital Transducer) electrodes that are arranged in an acoustic wave propagation direction. An average pitch of a plurality of electrode fingers of the IDT electrodes of the first IDT electrode group and an average pitch of a plurality of electrode fingers of the IDT electrodes of the second IDT electrode group are different from each other.

A filter device according to a preferred embodiment of the present invention includes a first filter provided between an input terminal and an output terminal; and an additional circuit connected in parallel with the first filter between the input terminal and the output terminal. The additional circuit includes an IDT electrode group including a plurality of IDT electrodes that are arranged in an acoustic wave propagation direction. The plurality of IDT electrodes of the IDT electrode group include at least two first IDT electrodes that are connected to the input terminal and at least two second IDT electrodes that are connected the output terminal. An average pitch of a plurality of electrode fingers of each of the at least two first IDT electrodes is different between the at least two first IDT electrodes, and an average pitch of a plurality of electrode fingers of each of the at least two second IDT electrodes is different between the at least two second IDT electrodes.

A multiplexer according to a preferred embodiment of the present invention includes a plurality of filters including a filter device according to a preferred embodiment of the present invention. Input terminals or output terminals of the plurality of filters are connected to a common terminal.

According to preferred embodiments of the present invention, it is possible to provide filter devices in each of which the attenuation characteristics are able to be effectively improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
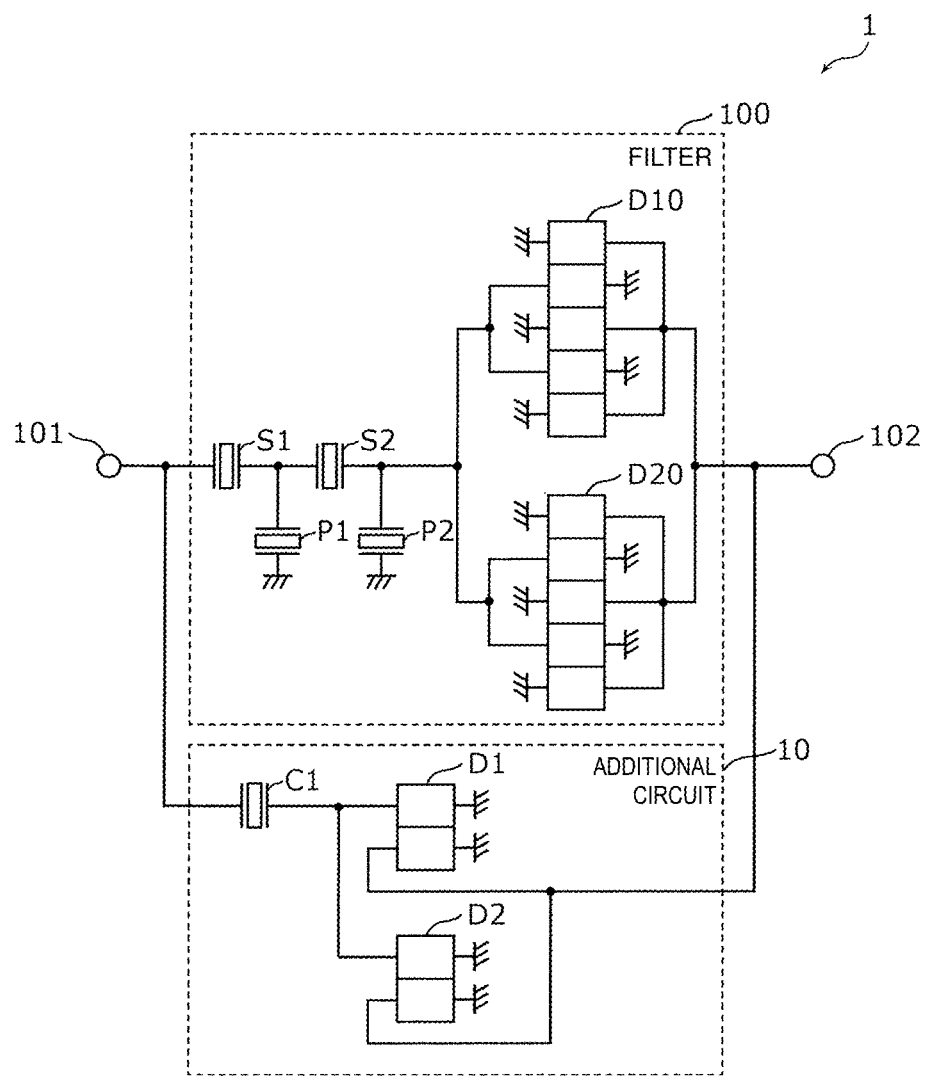
FIG. 1 is a configuration diagram illustrating an example of a filter device according to a first preferred embodiment of the present invention.

Hereinafter, preferred embodiments of the present invention will be described in detail with reference to the drawings. Note that all preferred embodiments described below illustrate general or specific examples. Numerical values, configurations, materials, elements, the arrangements and connections of elements, and so on in the following preferred embodiments are examples and are not intended to limit the present invention. Among the elements described in the following preferred embodiments, elements not recited in the independent claims are described as optional elements. The dimensions or dimensional ratios of the elements illustrated in the drawings are not necessarily accurate. In the drawings, the same or substantially the same configurations are denoted by the same reference numerals, and duplicated descriptions thereof may be omitted or briefly described. Further, in the following preferred embodiments, a state of "being connected" includes not only a case of direct connection but also a case of electrical connection with, for example, another element interposed.

First Preferred Embodiment

A first preferred embodiment of the present invention is described with reference to FIG. 1 to FIG. 7.

Configuration of Filter Device

FIG. 1 is a configuration diagram illustrating an example of a filter device 1 according to the first preferred embodiment.

The filter device 1 includes an input terminal 101 and an output terminal 102 and, for example, the input terminal 101 is connected to an antenna element and the output terminal 102 is connected to an RF signal processing circuit (RFIC) with, for example, a switch IC or an amplifier circuit interposed therebetween. The filter device 1 transmits an RF signal between the antenna element and the RF signal processing circuit. Note that the RF signal processing circuit may be connected to the input terminal 101, and the antenna element may be connected to the output terminal 102.

The filter device 1 includes a filter 100 and an additional circuit 10.

The filter 100 is a first filter provided between the input terminal 101 and the output terminal 102. The filter 100 is preferably, for example, an acoustic wave filter in which acoustic wave resonators are provided. The filter 100 includes series-arm resonators S1 and S2 and longitudinally coupled resonators D10 and D20 connected in parallel with each other, which are arranged on a path that connects the input terminal 101 and the output terminal 102. The series-arm resonators S1 and S2 and a circuit in which the longitudinally coupled resonators D10 and D20 are connected in parallel are connected in series with each other. The filter 100 further includes a parallel-arm resonator P1 that is connected between ground and a connection node between the series-arm resonator S1 and the series-arm resonator S2 and a parallel-arm resonator P2 that is connected between ground and a connection node between the series-arm resonator S2 and the circuit in which the longitudinally coupled resonators D10 and D20 are connected in parallel. The series-arm resonators S1 and S2, the parallel-arm resonators P1 and P2, and the longitudinally coupled resonators D10 and D20 define the passband of the filter 100.

Note that the filter 100 need not include the longitudinally coupled resonator D10 or D20, and the number of series-arm resonators and the number of parallel-arm resonators need not be those as illustrated in FIG. 1. Further, the filter 100 is not limited to an acoustic wave filter and may be, for example, an LC filter. For example, in the present preferred embodiment, the filter 100 is preferably an acoustic wave filter, and specifically, is a surface acoustic wave (SAW) filter. In this case, the following advantageous effects are produced. As described below, the additional circuit 10 includes longitudinally coupled resonators, and each longitudinally coupled resonator includes IDT electrodes that are arranged in the acoustic wave propagation direction without a reflector interposed therebetween. In a case where the filter 100 is a surface acoustic wave filter, the filter 100 also includes surface acoustic wave resonators, and the filter 100 and the additional circuit 10 can be provided on the same piezoelectric substrate. Accordingly, the filter 100 and the additional circuit 10 can be integrally provided, which can reduce the size of the filter device 1.

There has been a demand for CA in which a plurality of filters are connected in common and signals in a plurality of frequency bands that respectively correspond to the plurality of filters are simultaneously transmitted and received. At this time, to prevent leakage of a transmission signal into one filter among the plurality of filters, the transmission signal being in the passband of another filter connected in common to the one filter, it is necessary to improve the attenuation characteristics of the one filter in a frequency band (also called a counterpart band) corresponding to the passband of the other filter. Specifically, in recent years, the number of the plurality of filters connected in common has been increasing, and it is necessary to improve the attenuation characteristics of the one filter in a plurality of counterpart bands.

Accordingly, the additional circuit 10 is provided. The additional circuit 10 is a circuit that is connected in parallel with the filter 100 between the input terminal 101 and the output terminal 102. The additional circuit 10 generates a cancel signal that is a signal having a phase opposite to the phase of an unwanted signal, in each of the plurality of counterpart bands, leaking into the filter 100 and that cancels the unwanted signal. Here, a state where signals have opposite phases means that, within a range of −180° or more and +180° or less, the absolute value of the phase difference between the signals is greater than 90°. This is equivalent to a state where the signals have phase components in opposite directions. Note that preferably, the cancel signal has an amplitude the same or substantially the same as the amplitude of the unwanted signal if possible, but may have a different amplitude. In a case where an amplitude obtained as a result of the addition of a cancel signal component and an unwanted signal component becomes smaller than the amplitude of the original unwanted signal component in accordance with the phase difference between the cancel signal component and the unwanted signal component, the attenuation characteristics of the filter 100 can be improved. When the additional circuit 10 is connected in parallel with the filter 100, an unwanted signal that leaks into the filter 100 is canceled by a cancel signal generated by the additional circuit 10 at a connection point between the filter 100 and the additional circuit 10. Accordingly, the attenuation characteristics of the filter 100 is improved in the plurality of counterpart bands.

Note that another element may be connected between the input terminal 101 and a connection node between the input terminal 101 and the filter 100 (a connection point between the additional circuit 10 and a path that connects the input terminal 101 and the filter 100). For example, a series-arm resonator and a parallel-arm resonator may be provided between the input terminal 101 and the connection node. For example, the filter 100 need not include the series-arm resonator S1 or the parallel-arm resonator P1, and the series-arm resonator S1 and the parallel-arm resonator P1 may be provided between the input terminal 101 and the connection node instead.

The additional circuit 10 includes at least two IDT electrode groups connected in parallel with each other and one capacitance element C1 in order to generate a cancel signal. The at least two IDT electrode groups connected in parallel with each other include a longitudinally coupled resonator D1 as a first IDT electrode group and a longitudinally coupled resonator D2 as a second IDT electrode group. In the present preferred embodiment, the additional circuit 10 includes the two longitudinally coupled resonators D1 and D2 as the at least two longitudinally coupled resonators. However, the additional circuit 10 may include three or more longitudinally coupled resonators. The at least two longitudinally coupled resonators (IDT electrode groups) each include a plurality of IDT electrodes arranged in the acoustic wave propagation direction. Note that in the present preferred embodiment, the IDT electrode groups are preferably longitudinally coupled resonators that transmit signals by using coupling of an acoustic wave, for example. However, the IDT electrode groups are not limited to this example and may be, for example, transversal filters that transmit signals by using propagation of an acoustic wave. Further, the at least two IDT electrode groups may include, for example, both a longitudinally coupled resonator and a transversal filter.

The additional circuit 10 includes the capacitance element C1 as at least either one capacitance element provided between the input terminal 101 and the at least two longitudinally coupled resonators or one capacitance element provided between the output terminal 102 and the at least two longitudinally coupled resonators. Note that the additional circuit 10 may include one capacitance element between the output terminal 102 and the at least two longitudinally coupled resonators or may include one capacitance element between the input terminal 101 and the at least two longitudinally coupled resonators and one capacitance element between the output terminal 102 and the at least two longitudinally coupled resonators. Only one capacitance element C1 is provided on at least the input terminal 101 side or the output terminal 102 side of the two longitudinally coupled resonators D1 and D2. In other words, the capacitance element C1 is not provided for each of the two longitudinally coupled resonators D1 and D2 on the input terminal 101 side or the output terminal 102 side.

The capacitance element C1 adjusts (specifically, decreases) the amplitude of a signal input to the capacitance element C1 in order to generate a cancel signal having an amplitude the same or substantially the same as the amplitude of an unwanted signal, in a counterpart band, leaking into the filter 100. Here, as the capacitance element C1, for example, an acoustic wave resonator is preferably used. This is because an acoustic wave resonator becomes inductive in a band between its resonant frequency and its anti-resonant frequency and becomes capacitive in the other band, and therefore, can be handled as a capacitance element in the other band. For example, the plurality of counterpart bands are included in the other band. Note that the capacitance element C1 is not limited to an acoustic wave resonator and may be, for example, a capacitor. The capacitor may be defined by a conductive pattern on a substrate or may be a chip capacitor mounted on a substrate, for example.

The longitudinally coupled resonator D1 adjusts the amplitude and phase of a signal input to the longitudinally coupled resonator D1 in order to generate a cancel signal having a phase opposite to the phase of and an amplitude the same or substantially the same as the amplitude of an unwanted signal in one counterpart band. The longitudinally coupled resonator D2 adjusts the amplitude and phase of a signal input to the longitudinally coupled resonator D2 in order to generate a cancel signal having a phase opposite to the phase of and an amplitude the same or substantially the same as the amplitude of an unwanted signal in a counterpart band different from the one counterpart band.

In the additional circuit 10, the amplitude of a signal input to the capacitance element C1 is adjusted by the capacitance element C1 to a large degree across a wide frequency band. Thereafter, the amplitude and phase of the signal, in one counterpart band, input to the longitudinally coupled resonator D1 are adjusted by the longitudinally coupled resonator D1 in order to cancel an unwanted signal in the one counterpart band, and the amplitude and phase of the signal, in a counterpart band different from the one counterpart band, input to the longitudinally coupled resonator D2 are adjusted by the longitudinally coupled resonator D2 in order to cancel an unwanted signal in the counterpart band different from the one counterpart band.

Basic Structure of Resonator

Now, the basic structure of each resonator (each resonator used in the series-arm resonators, parallel-arm resonators, and longitudinally coupled resonators) defining the filter device 1 is described. In the present preferred embodiment, the resonator is preferably a surface acoustic wave resonator, for example.

Figure 2:
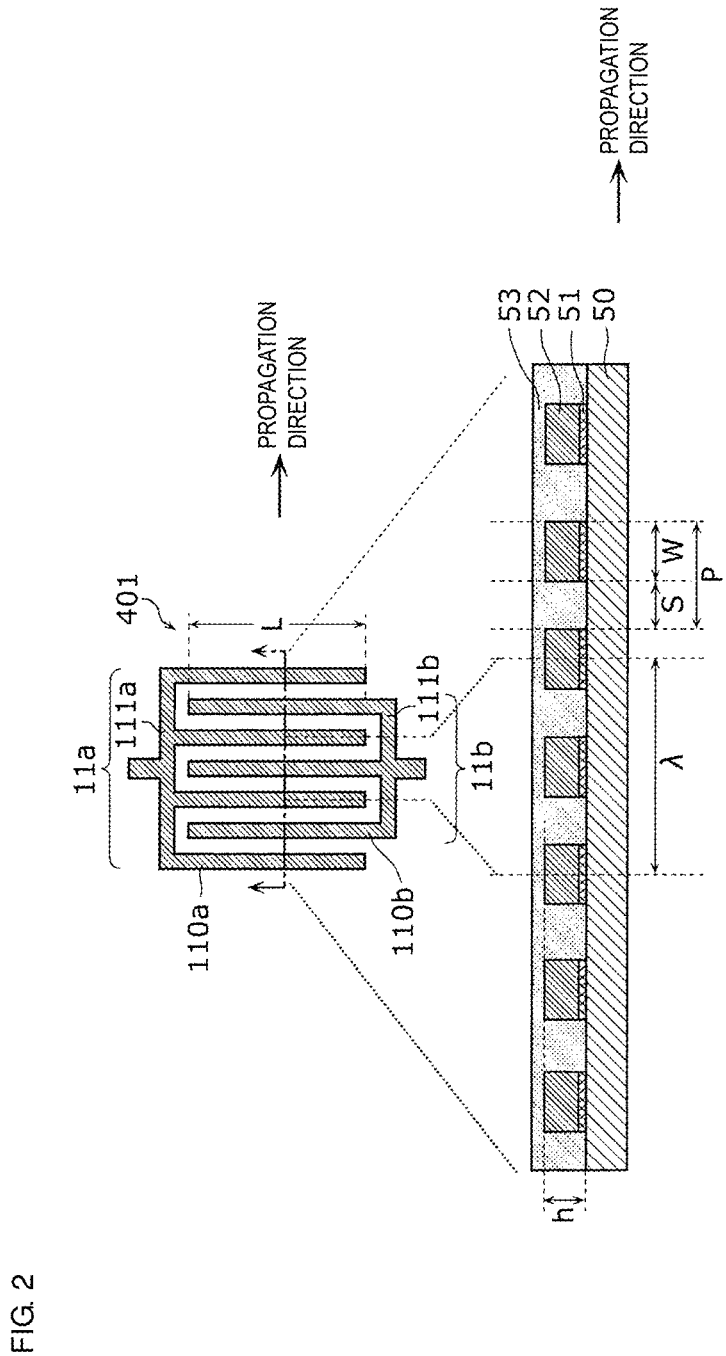
FIG. 2 includes a schematic plan view and a schematic cross-sectional view of a surface acoustic wave resonator.

FIG. 2 includes a schematic plan view and a schematic cross-sectional view of the surface acoustic wave resonator. FIG. 2 includes a schematic plan view and a schematic cross-sectional view illustrating the structure of a resonator 401, which is an example of each resonator of the filter device 1. Note that the resonator 401 illustrated in FIG. 2 is for explaining a typical structure of each resonator described above and, for example, the number and lengths of electrode fingers of an electrode are not limited to those as illustrated in FIG. 2.

As illustrated by the plan view in FIG. 2, the resonator 401 includes a pair of comb-shaped electrodes 11a and 11b that face each other. Although not illustrated, the resonator 401 further includes a reflector that is arranged adjacent to the pair of comb-shaped electrodes 11a and 11b in the propagation direction of an acoustic wave. The pair of comb-shaped electrodes 11a and 11b define an IDT electrode.

The comb-shaped electrode 11a includes a plurality of electrode fingers 110a arranged in a comb shape and that are parallel or substantially parallel to each other and a busbar electrode 111a that connects the ends of the plurality of electrode fingers 110a with each other. The comb-shaped electrode 11b includes a plurality of electrode fingers 110b arranged in a comb shape and that are parallel or substantially parallel to each other and a busbar electrode 111b that connects the ends of the plurality of electrode fingers 110b with each other. The plurality of electrode fingers 110a and 110b extend in a direction orthogonal or substantially orthogonal to the acoustic wave propagation direction.

The IDT electrode defined by the plurality of electrode fingers 110a and 110b and the busbar electrodes 111a and 111b has a layered structure including a close-contact layer 51 and a main electrode layer 52 as illustrated by the cross-sectional view in FIG. 2.

The close-contact layer 51 improves close contact between a piezoelectric substrate 50 and the main electrode layer 52 and, for example, Ti is preferably used as a material. The film thickness of the close-contact layer 51 is preferably, for example, about 12 nm.

As a material of the main electrode layer 52, for example, Al that includes 1% Cu is preferably used. The film thickness of the main electrode layer 52 is preferably, for example, about 162 nm.

A protective layer 53 covers the IDT electrode. For example, the protective layer 53 protects the main electrode layer 52 from an external environment, adjusts the frequency temperature characteristics, and increases moisture resistance and is a film preferably including, for example, silicon dioxide as a main component. The film thickness of the protective layer 53 is preferably, for example, about 25 nm.

Note that materials used for the close-contact layer 51, the main electrode layer 52, and the protective layer 53 are not limited to the above-described materials. Further, the IDT electrode need not have a layered structure described above. The IDT electrode may be made of, for example, a metal, such as Ti, Al, Cu, Pt, Au, Ag, or Pd, or an alloy thereof, or may include a plurality of multilayer bodies made of the above-described metals or an alloy thereof. The protective layer 53 need not be provided.

The piezoelectric substrate 50 includes a main surface on which the IDT electrode and the reflector are provided and that has piezoelectricity. The piezoelectric substrate 50 is preferably made of, for example, a 42° Y-cut X-propagation LiTaO$_3$ piezoelectric single crystal or piezoelectric ceramic (a lithium tantalite single crystal or ceramic that is cut along a plane with an axis normal to the plane, the axis being an axis rotated by about 42° from the Y axis while the X axis is assumed to be the center axis and through which a surface acoustic wave propagates in the X-axis direction).

The piezoelectric substrate 50 has a layered structure in which a high-acoustic-velocity support substrate, a low-acoustic-velocity film, and a piezoelectric film are stacked in this order. The piezoelectric film is preferably formed of, for example, a 42° Y-cut X-propagation LiTaO$_3$ piezoelectric single crystal or piezoelectric ceramic. The piezoelectric film preferably has a thickness of, for example, about 600 nm. The high-acoustic-velocity support substrate supports the low-acoustic-velocity film, the piezoelectric film, and the IDT electrode. The high-acoustic-velocity support substrate is a substrate in which the acoustic velocity of a bulk wave inside the high-acoustic-velocity support substrate is higher than that of a surface acoustic wave or a boundary acoustic wave that propagates along the piezoelectric film, and confines a surface acoustic wave in a portion in which the piezoelectric film and the low-acoustic-velocity film are stacked to prevent the surface acoustic wave from leaking below the high-acoustic-velocity support substrate. The high-acoustic-velocity support substrate is preferably, for example, a silicon substrate and has a thickness of, for example, about 200 μm. The low-acoustic-velocity film is a film in which the acoustic velocity of a bulk wave inside the low-acoustic-velocity film is lower than that of a bulk wave that propagates along the piezoelectric film, and is provided between the piezoelectric film and the high-acoustic-velocity support substrate. This structure and the property that the energy of an acoustic wave concentrates in a low-acoustic-velocity medium reduce or prevent leakage of the energy of a surface acoustic wave to the outside of the IDT electrode. The low-acoustic-velocity film preferably, for example, includes silicon dioxide as a main component and has a thickness of, for example, about 670 nm. Note that a joint layer made of, for example, Ti or Ni may be included within the low-acoustic-velocity film. The low-acoustic-velocity film may have a multilayer structure including a plurality of low-acoustic-velocity materials. With this layered structure, the Q values at the resonant frequency and at the anti-resonant frequency can be significantly increased compared with a structure in which the piezoelectric substrate 50 is a single layer. That is, a surface acoustic wave resonator having a high Q value can be provided, and this surface acoustic wave resonator can be used to provide a filter having a small insertion loss.

Note that the high-acoustic-velocity support substrate may have a structure in which a support substrate and a high-acoustic-velocity film in which the acoustic velocity of a propagating bulk wave is higher than that of a surface acoustic wave or a boundary acoustic wave that propagates along the piezoelectric film are stacked. In this case, as the support substrate, for example, a piezoelectric body, such as lithium tantalite, lithium niobate, or crystal, various types of ceramic, such as alumina, magnesia, silicon nitride, aluminum nitride, silicon carbide, zirconia, cordierite, mullite, steatite, and forsterite, a dielectric, such as glass or sapphire, a semiconductor, such as silicon or gallium nitride, and a resin substrate can be used. As the high-acoustic-velocity film, various high-acoustic-velocity materials, such as, for example, aluminum nitride, aluminum oxide, silicon carbide, silicon nitride, silicon oxynitride, a DLC film, or diamond, a medium including the above-described materials as main components, and a medium including a mixture of the above-described materials as a main component, can be used.

Here, the electrode parameters of the IDT electrode that defines the surface acoustic wave resonator are described.

The wavelength of the surface acoustic wave resonator is defined by a wavelength λ that is the repetition period of the plurality of electrode fingers 110a and 110b of the IDT electrode illustrated in FIG. 2. The electrode pitch P is one-half of the wavelength λ and is defined as (W+S) when the line width of the electrode fingers 110a and 110b that define the comb-shaped electrodes 11a and 11b is denoted by W and the space width between the electrode fingers 110a and 110b adjacent to each other is denoted by S. The overlap width L of the pair of comb-shaped electrodes 11a and 11b is the length of overlapping electrode fingers when viewed from the propagation direction. The electrode duty R of each resonator is the line width occupation ratio of the plurality of electrode fingers 110a and 110b, is the ratio of the line width of the plurality of electrode fingers 110a and 110b to the value obtained by adding the line width and the space width thereof, and is defined as W/(W+S). The number of the plurality of electrode fingers 110a and 110b of the IDT electrode is the total number of the electrode fingers 110a and 110b. For example, in FIG. 2 that schematically illustrates the surface acoustic wave resonator, the number of the plurality of electrode fingers 110a and 110b is 7. The film thickness of the IDT electrode is the thickness h of the plurality of electrode fingers 110a and 110b.

Longitudinally Coupled Resonators in Additional Circuit

Now, the longitudinally coupled resonators D1 and D2 in the additional circuit 10 are described with reference to FIG. 3, Table 1, and Table 2.

Figure 3:
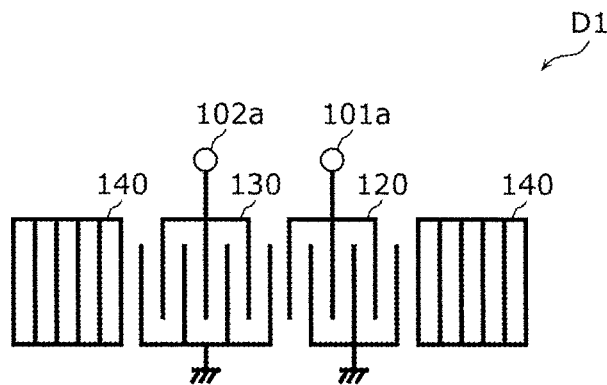
FIG. 3 is a schematic plan view of an example of a longitudinally coupled resonator according to the first preferred embodiment of the present invention.

FIG. 3 is a schematic plan view of an example of the longitudinally coupled resonator D1 according to the first preferred embodiment. Note that the electrode parameters of the IDT electrodes of the longitudinally coupled resonator D2 are different from those of the IDT electrodes of the longitudinally coupled resonator D1, but the basic configuration of the longitudinally coupled resonator D2 is the same or substantially the same as that of the longitudinally coupled resonator D1. Accordingly, when the reference numeral "D1" in FIG. 3 is replaced by the reference numeral "D2", FIG. 3 is a schematic plan view of an example of the longitudinally coupled resonator D2 according to the first preferred embodiment. FIG. 3 schematically illustrates the longitudinally coupled resonator D1, and the number and the pitches of the plurality of electrode fingers of each of the IDT electrodes that define the longitudinally coupled resonator D1 in the first preferred embodiment are not limited to those as illustrated in FIG. 3.

The plurality of IDT electrodes that define the longitudinally coupled resonator D1 include at least one first IDT electrode that is connected to the input terminal 101 and at least one second IDT electrode that is connected to the output terminal 102, and the plurality of IDT electrodes that define the longitudinally coupled resonator D2 include at least one first IDT electrode that is connected to the input terminal 101 and at least one second IDT electrode that is connected to the output terminal 102. Here, the plurality of IDT electrodes that define the longitudinally coupled resonator D1 include one IDT electrode 120 as the at least one first IDT electrode and one IDT electrode 130 as the at least one second IDT electrode, and the plurality of IDT electrodes that define the longitudinally coupled resonator D2 include one IDT electrode 120 as the at least one first IDT electrode and one IDT electrode 130 as the at least one second IDT electrode. Note that the plurality of IDT electrodes that define the longitudinally coupled resonator D1 may include two or more IDT electrodes 120 as the at least one first IDT electrode and two or more IDT electrodes 130 as the at least one second IDT electrode, and the plurality of IDT electrodes that define the longitudinally coupled resonator D2 may include two or more IDT electrodes 120 as the at least one first IDT electrode and two or more IDT electrodes 130 as the at least one second IDT electrode. The IDT electrode 120 includes a terminal 101a that is connected to the input terminal 101 with the capacitance element C1 interposed therebetween, and the IDT electrode 130 includes a terminal 102a that is connected to the output terminal 102. The plurality of IDT electrodes that define the longitudinally coupled resonator D1 may include reflectors 140 that sandwich the IDT electrodes 120 and 130 in the propagation direction of an acoustic wave, and the plurality of IDT electrodes that define the longitudinally coupled resonator D2 may include reflectors 140 that sandwich the IDT electrodes 120 and 130 in the propagation direction of an acoustic wave. In a case where the additional circuit 10 includes transversal filters as the IDT electrode groups, a sound absorbing material may be provided, instead of the reflectors 140.

As described above, when the additional circuit 10 is connected in parallel with the filter 100, unwanted signals, in a plurality of counterpart bands, leaking into the filter 100 can be canceled. This is because a plurality of resonant modes can be produced in the additional circuit 10. Specifically, this is because when the electrode parameters of the plurality of IDT electrodes that define the longitudinally coupled resonator D1 are adjusted, the resonant frequency of one resonant mode can be adjusted, and when the electrode parameters of the plurality of IDT electrodes that define the longitudinally coupled resonator D2 are adjusted, the resonant frequency of another resonant mode can be adjusted. At this time, the electrode parameters are adjusted such that the resonant frequencies of the plurality of resonant modes are in different frequency bands. Specifically, an adjustment is made such that the resonant frequency of one resonant mode becomes close to the center frequency of one counterpart band, and an adjustment is made such that the resonant frequency of another resonant mode becomes close to the center frequency of a counterpart band different from the one counterpart band. Accordingly, the additional circuit 10 can generate a cancel signal that has a phase opposite to the phase of and an amplitude the same or substantially the same as the amplitude of an unwanted signal in each of the plurality of counterpart bands, and the unwanted signal in each of the plurality of counterpart bands can be canceled. This is because a phase inversion effect occurs in the longitudinally coupled resonator mainly at a frequency close to the resonant frequency of the resonant mode.

Now, the electrode parameters of the plurality of IDT electrodes that define the longitudinally coupled resonator D1 and the electrode parameters of the plurality of IDT electrodes that define the longitudinally coupled resonator D2 to cancel unwanted signals in the plurality of counterpart bands are described with reference to Table 1 and Table 2. Table 1 indicates the electrode parameters of the plurality of IDT electrodes that define the longitudinally coupled resonator D1. Table 2 indicates the electrode parameters of the plurality of IDT electrodes that define the longitudinally coupled resonator D2.

TABLE 1

| Longitudinally coupled resonator D1 | Overlap width (μm) | Number of electrode fingers | Average pitch (μm) | Overall average pitch (μm) |
|---|---|---|---|---|
| IDT electrode 120 | 89.5 | 14 | 2.2573 | 2.4045 |
| IDT electrode 130 | | 22 | 2.4983 | |

TABLE 2

| Longitudinally coupled resonator D2 | Overlap width (μm) | Number of electrode fingers | Average pitch (μm) | Overall average pitch (μm) |
|---|---|---|---|---|
| IDT electrode 120 | 89.5 | 10 | 2.4094 | 2.5450 |
| IDT electrode 130 | | 14 | 2.6419 | |

The average pitch of the plurality of electrode fingers of the IDT electrodes 120 and 130 that define the longitudinally coupled resonator D1 is about 2.4045 μm, for example, and the average pitch of the plurality of electrode fingers of the IDT electrodes 120 and 130 that define the longitudinally coupled resonator D2 is about 2.5450 μm, for example. The average pitch of the plurality of electrode fingers of the IDT electrodes 120 and 130 that define the longitudinally coupled resonator D1 and the average pitch of the plurality of electrode fingers of the IDT electrodes 120 and 130 that define the longitudinally coupled resonator D2 are different from each other. Note that the average pitch of the plurality of electrode fingers of the IDT electrodes 120 and 130 is obtained by dividing the sum total of the pitches of all of the electrode fingers of the IDT electrodes 120 and 130 excluding the reflectors 140 by the number of all of the electrode fingers of the IDT electrodes 120 and 130.

When the average pitch of the plurality of electrode fingers is adjusted, the resonant frequency of the resonant mode can be adjusted. That is, when the average pitch of the plurality of electrode fingers is different between the longitudinally coupled resonator D1 and the longitudinally coupled resonator D2, the resonant frequencies of the plurality of resonant modes can be adjusted so as to be in different frequency bands, and the additional circuit 10 can generate a cancel signal having a phase opposite to the phase of an unwanted signal in each of the plurality of counterpart bands.

The number of the plurality of electrode fingers of the IDT electrode 120 in the longitudinally coupled resonator D1 is preferably 14, for example, the number of the plurality of electrode fingers of the IDT electrode 120 in the longitudinally coupled resonator D2 is preferably 10, for example, and the number of the plurality of electrode fingers of the IDT electrode 120 in the longitudinally coupled resonator D1 and the number of the plurality of electrode fingers of the IDT electrode 120 in the longitudinally coupled resonator D2 are different from each other. The number of the plurality of electrode fingers of the IDT electrode 130 in the longitudinally coupled resonator D1 is preferably 22, for example, the number of the plurality of electrode fingers of the IDT electrode 130 in the longitudinally coupled resonator D2 is preferably 14, for example, and the number of the plurality of electrode fingers of the IDT electrode 130 in the longitudinally coupled resonator D1 and the number of the plurality of electrode fingers of the IDT electrode 130 in the longitudinally coupled resonator D2 are different from each other.

When the number of the plurality of electrode fingers is adjusted, the frequency bandwidth of the resonant mode can be adjusted. That is, when the number of the plurality of electrode fingers of the IDT electrode 120 on the input terminal 101 side is different between the longitudinally coupled resonator D1 and the longitudinally coupled resonator D2, and the number of the plurality of electrode fingers of the IDT electrode 130 on the output terminal 102 side is different between the longitudinally coupled resonator D1 and the longitudinally coupled resonator D2, for each counterpart band, a frequency bandwidth in which a cancel signal has a phase opposite to the phase of an unwanted signal can be adjusted so as to match the bandwidth of the counterpart band. Further, when the number of the plurality of electrode fingers is adjusted, for each counterpart band, the amplitude characteristics of a cancel signal can be adjusted. This is because when the number of the plurality of electrode fingers of the IDT electrode 120 on the input terminal 101 side is adjusted, the input impedance that affects the amplitude can be adjusted, and when the number of the plurality of electrode fingers of the IDT electrode 130 on the output terminal 102 side is adjusted, the output impedance that affects the amplitude can be adjusted. As described above, a frequency bandwidth in which a cancel signal has a phase opposite to the phase of an unwanted signal can be adjusted in accordance with the counterpart bandwidth, and the amplitude of the cancel signal in the frequency bandwidth can be adjusted in accordance with the amplitude of the unwanted signal. Accordingly, an optimum amplitude adjustment and an optimum phase adjustment can be made for each counterpart band, and advantageous effects of cancelation of unwanted signals can be increased.

Further, the average pitch of the plurality of electrode fingers of the IDT electrode 120 in the longitudinally coupled resonator D1 is about 2.2573 μm, for example, the average pitch of the plurality of electrode fingers of the IDT electrode 120 in the longitudinally coupled resonator D2 is about 2.4094 μm, for example, and the average pitch of the plurality of electrode fingers of the IDT electrode 120 in the longitudinally coupled resonator D1 and the average pitch of the plurality of electrode fingers of the IDT electrode 120 in the longitudinally coupled resonator D2 are different from each other. The average pitch of the plurality of electrode fingers of the IDT electrode 130 in the longitudinally coupled resonator D1 is about 2.4983 μm, for example, the average pitch of the plurality of electrode fingers of the IDT electrode 130 in the longitudinally coupled resonator D2 is about 2.6419 μm, for example, and the average pitch of the plurality of electrode fingers of the IDT electrode 130 in the longitudinally coupled resonator D1 and the average pitch of the plurality of electrode fingers of the IDT electrode 130 in the longitudinally coupled resonator D2 are different from each other. Note that the average pitch of the plurality of electrode fingers of the IDT electrode 120 is obtained by dividing the sum total of the pitches of all of the electrode fingers of the IDT electrode 120 by the number of all of the electrode fingers of the IDT electrode 120. The average pitch of the plurality of electrode fingers of the IDT electrode 130 is obtained by dividing the sum total of the pitches of all of the electrode fingers of the IDT electrode 130 by the number of all of the electrode fingers of the IDT electrode 130.

As described above, when the average pitch of the plurality of electrode fingers is adjusted, the resonant frequency of the resonant mode can be adjusted. At this time, when the average pitch of the plurality of electrode fingers of the IDT electrode 120 on the input terminal 101 side is made different between the longitudinally coupled resonator D1 and the longitudinally coupled resonator D2 and the average pitch of the plurality of electrode fingers of the IDT electrode 130 on the output terminal 102 side is different between the longitudinally coupled resonator D1 and the longitudinally coupled resonator D2, a frequency and a frequency bandwidth in which a cancel signal has a phase opposite to the phase of an unwanted signal can be minutely adjusted.

Note that the overlap width of the plurality of electrode fingers of the IDT electrodes 120 and 130 that define the longitudinally coupled resonator D1 and the overlap width of the plurality of electrode fingers of the IDT electrodes 120 and 130 that define the longitudinally coupled resonator D2 are, for example, about 89.5 µm and are the same. However, the overlap width of the plurality of electrode fingers of the IDT electrodes 120 and 130 that define the longitudinally coupled resonator D1 and the overlap width of the plurality of electrode fingers of the IDT electrodes 120 and 130 that define the longitudinally coupled resonator D2 may be different from each other. When the overlap width of the plurality of electrode fingers is adjusted, the amplitude characteristics of a cancel signal can also be adjusted.

Comparison with First and Second Comparative Examples

Advantageous effects produced by adjusting the electrode parameters of the plurality of IDT electrodes that define the longitudinally coupled resonator D1 and the electrode parameters of the plurality of IDT electrodes that define the longitudinally coupled resonator D2 as indicated in Table 1 and Table 2 are described by comparing with first and second comparative examples.

The circuit configuration of a filter device according to the first comparative example is the same or substantially the same as the circuit configuration of the filter device 1 according to the first preferred embodiment (see FIG. 1 and FIG. 3), except the electrode parameters are different from those of the first preferred embodiment.

Table 3 indicates the electrode parameters of the IDT electrodes in the filter device according to the first comparative example.

TABLE 3

| Longitudinally coupled resonator D1, D2 | Overlap width (µm) | Number of electrode fingers | Average pitch (µm) | Overall average pitch (µm) |
|---|---|---|---|---|
| IDT electrode 120 | 68.6 | 24 | 2.2946 | 2.3629 |
| IDT electrode 130 | | 14 | 2.4801 | |

In the filter device according to the first comparative example, the electrode parameters of the plurality of IDT electrodes that define the longitudinally coupled resonator D1 are the same or substantially the same as the electrode parameters of the plurality of IDT electrodes that define the longitudinally coupled resonator D2. Specifically, the overall average pitch of the plurality of electrode fingers of the IDT electrodes 120 and 130 that define the longitudinally coupled resonator D1 and the overall average pitch of the plurality of electrode fingers of the IDT electrodes 120 and 130 that define the longitudinally coupled resonator D2 are about 2.3629 µm and are the same. The number of the plurality of electrode fingers of the IDT electrode 120 in the longitudinally coupled resonator D1 and the number of the plurality of electrode fingers of the IDT electrode 120 in the longitudinally coupled resonator D2 are 24 and are the same, and the number of the plurality of electrode fingers of the IDT electrode 130 in the longitudinally coupled resonator D1 and the number of the plurality of electrode fingers of the IDT electrode 130 in the longitudinally coupled resonator D2 are 14 and are the same. Further, the average pitch of the plurality of electrode fingers of the IDT electrode 120 in the longitudinally coupled resonator D1 and the average pitch of the plurality of electrode fingers of the IDT electrode 120 in the longitudinally coupled resonator D2 are about 2.2946 µm and are the same, and the average pitch of the plurality of electrode fingers of the IDT electrode 130 in the longitudinally coupled resonator D1 and the average pitch of the plurality of electrode fingers of the IDT electrode 130 in the longitudinally coupled resonator D2 are about 2.4801 µm and are the same.

The circuit configuration of a filter device 2 according to the second comparative example is different from the circuit configuration of the filter device 1 according to the first preferred embodiment.

Figure 4:
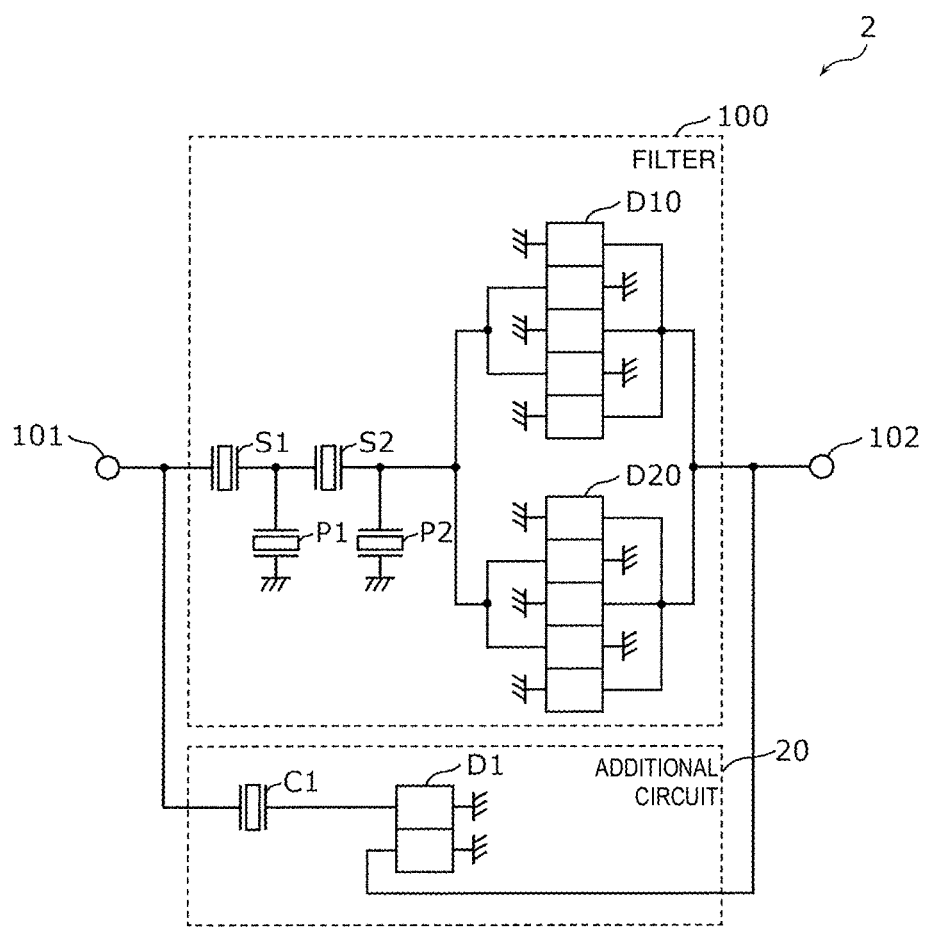
FIG. 4 is a configuration diagram illustrating an example of a filter device according to a second comparative example.

FIG. 4 is a configuration diagram illustrating an example of the filter device 2 according to the second comparative example.

The filter device 2 according to the second comparative example is different from the filter device 1 according to the first preferred embodiment in that the filter device 2 includes an additional circuit 20, instead of the additional circuit 10. The additional circuit 20 is different from the additional circuit 10 in that the additional circuit 20 does not include the longitudinally coupled resonator D2. That is, in the second comparative example, the additional circuit 20 includes only one longitudinally coupled resonator, which is a difference from the filter device 1 in the first preferred embodiment.

Table 4 indicates the electrode parameters of the IDT electrodes in the filter device 2 according to the second comparative example.

TABLE 4

| Longitudinally coupled resonator D1 | Overlap width (µm) | Number of electrode fingers | Average pitch (µm) | Overall average pitch (µm) |
|---|---|---|---|---|
| IDT electrode 120 | 90.0 | 24 | 2.2994 | 2.3829 |
| IDT electrode 130 | | 18 | 2.4943 | |

The additional circuit 10 according to the first preferred embodiment can generate a cancel signal having a phase opposite to the phase of an unwanted signal in each of the plurality of counterpart bands, but the additional circuits according to the first and second comparative examples have difficulty in generating a cancel signal having a phase opposite to the phase of an unwanted signal in each the plurality of counterpart bands, which is described with reference to FIG. 5 and FIG. 6.

Figure 5:
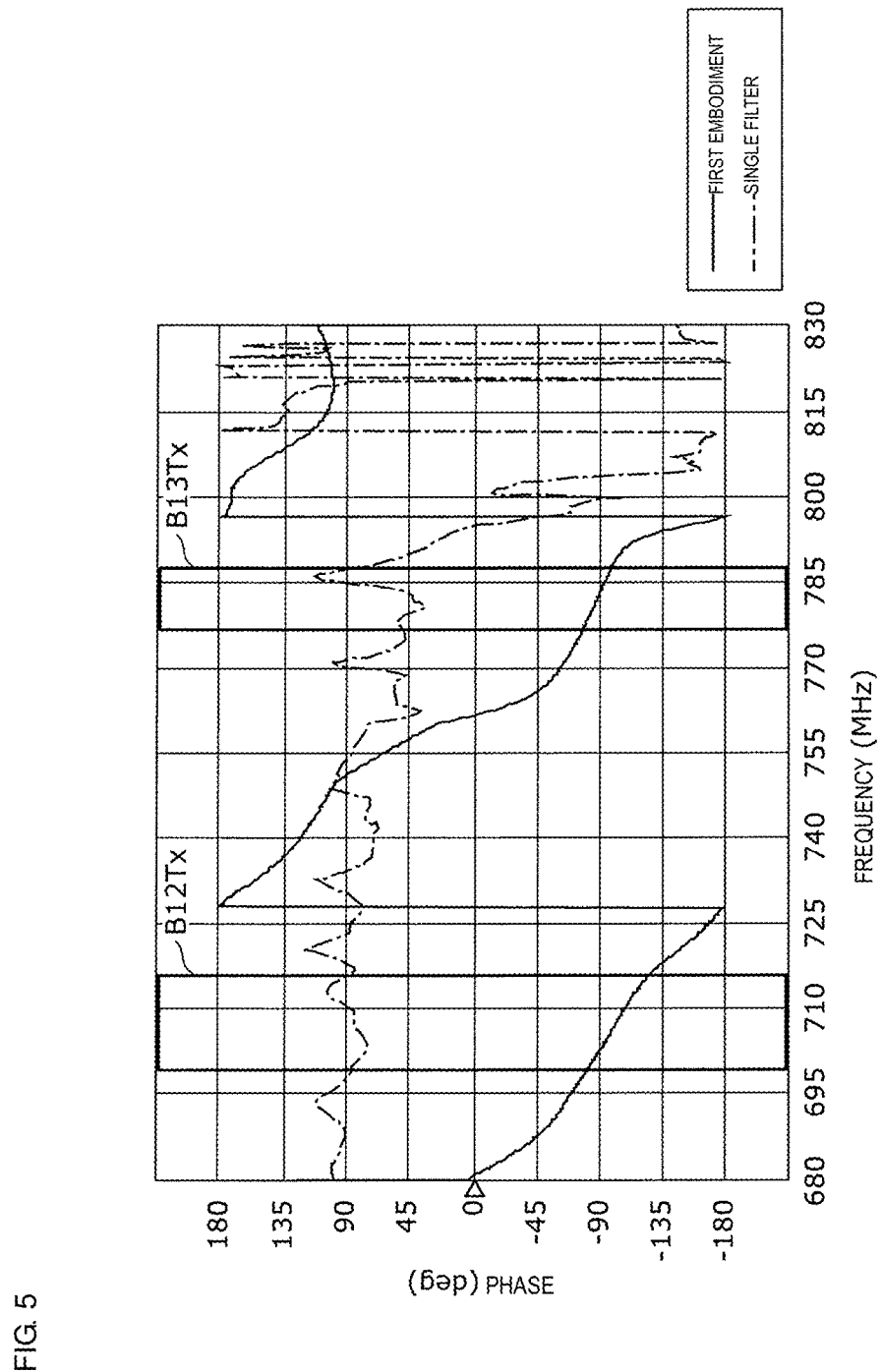
FIG. 5 is a graph showing the phase characteristics of an additional circuit according to the first preferred embodiment of the present invention and those of a single filter.

FIG. 5 is a graph showing the phase characteristics of the additional circuit 10 according to the first preferred embodiment and those of the filter 100. The phase characteristics of the additional circuit 10 according to the first preferred embodiment are indicated by a solid line, and the phase characteristics of the filter 100 are indicated by a dot-dash line.

For example, it is assumed that the filter device 1 is a filter that is included in a multiplexer in which three filters are connected in common to enable CA in which signals in a plurality of frequency bands corresponding to the three respective filters are simultaneously transmitted and received. The plurality of frequency bands that correspond to the three respective filters are, for example, Band26Rx (about 859 MHz to about 894 MHz), Band12Tx (about 699 MHz to about 716 MHz), and Band13Tx (about 777 MHz to about 787 MHz) of LTE (Long Term Evolution: 4G). Note that Band26Rx, Band12Tx, and Band13Tx are hereinafter also referred to as B26Rx, B12Tx, and B13Tx respectively. For example, it is assumed that the passband of the filter device 1 (filter 100) is B26Rx and that the passbands (that is, counterpart bands) of the other filters that are connected in common to the filter device 1 are B12Tx and B13Tx. In this case, focusing on the filter device 1, it is necessary to improve the attenuation characteristics of the filter device 1 in frequency bands corresponding to B12Tx and B13Tx, which are the counterpart bands, so as to prevent transmission signals in B12Tx and B13Tx, which are the counterpart bands, from leaking into the filter device 1. Accordingly, the additional circuit 10 needs to generate a cancel signal having a phase opposite to the phase of an unwanted signal in each of the plurality of counterpart bands (B12Tx and B13Tx).

In FIG. 5, portions surrounded by a thick solid line are the frequency bands corresponding to B12Tx and B13Tx. As shown in FIG. 5, both in B12Tx and B13Tx, the phase difference between the additional circuit 10 and the filter 100 is about 180 degrees. That is, the additional circuit 10 can generate a cancel signal having a phase opposite to the phase of an unwanted signal in each of the plurality of counterpart bands (B12Tx and B13Tx).

In the first preferred embodiment, as indicated in Table 1 and Table 2, when the average pitch of the plurality of electrode fingers is different between the longitudinally coupled resonator D1 and the longitudinally coupled resonator D2, a plurality of resonant modes can be produced, and the resonant frequencies of the plurality of resonant modes can be adjusted so as to be in different frequency bands. Specifically, the resonant frequency of one resonant mode among the plurality of resonant modes can be set to approximately the center frequency of B12Tx, and the resonant frequency of the other resonant mode can be set to approximately the center frequency of B13Tx. Accordingly, the additional circuit 10 can generate a cancel signal having a phase opposite to the phase of an unwanted signal in each of the plurality of counterpart bands.

Note that in general, the center frequencies of the plurality of counterpart bands are spaced apart from each other by about 5% or more as in B12Tx and B13Tx, and therefore, it is preferable to make the average pitch of the plurality of electrode fingers different by about 5% or more between the longitudinally coupled resonator D1 and the longitudinally coupled resonator D2. For example, in the first preferred embodiment, the average pitch in the longitudinally coupled resonator D2 is preferably different from the average pitch in the longitudinally coupled resonator D1 by about 5.8%.

Further, in the first preferred embodiment, as indicated in Table 1 and Table 2, when the number of the plurality of electrode fingers of the IDT electrode 120 on the input terminal 101 side is different between the longitudinally coupled resonator D1 and the longitudinally coupled resonator D2 and the number of the plurality of electrode fingers of the IDT electrode 130 on the output terminal 102 side is different between the longitudinally coupled resonator D1 and the longitudinally coupled resonator D2, a bandwidth in which the phase is opposite to the phase of an unwanted signal can be adjusted. Specifically, the phase difference is about 180 degrees across the bandwidth of B12Tx (about 699 MHz to about 716 MHz) and the phase difference is about 180 degrees across the bandwidth of B13Tx (about 777 MHz to about 787 MHz).

Figure 6:
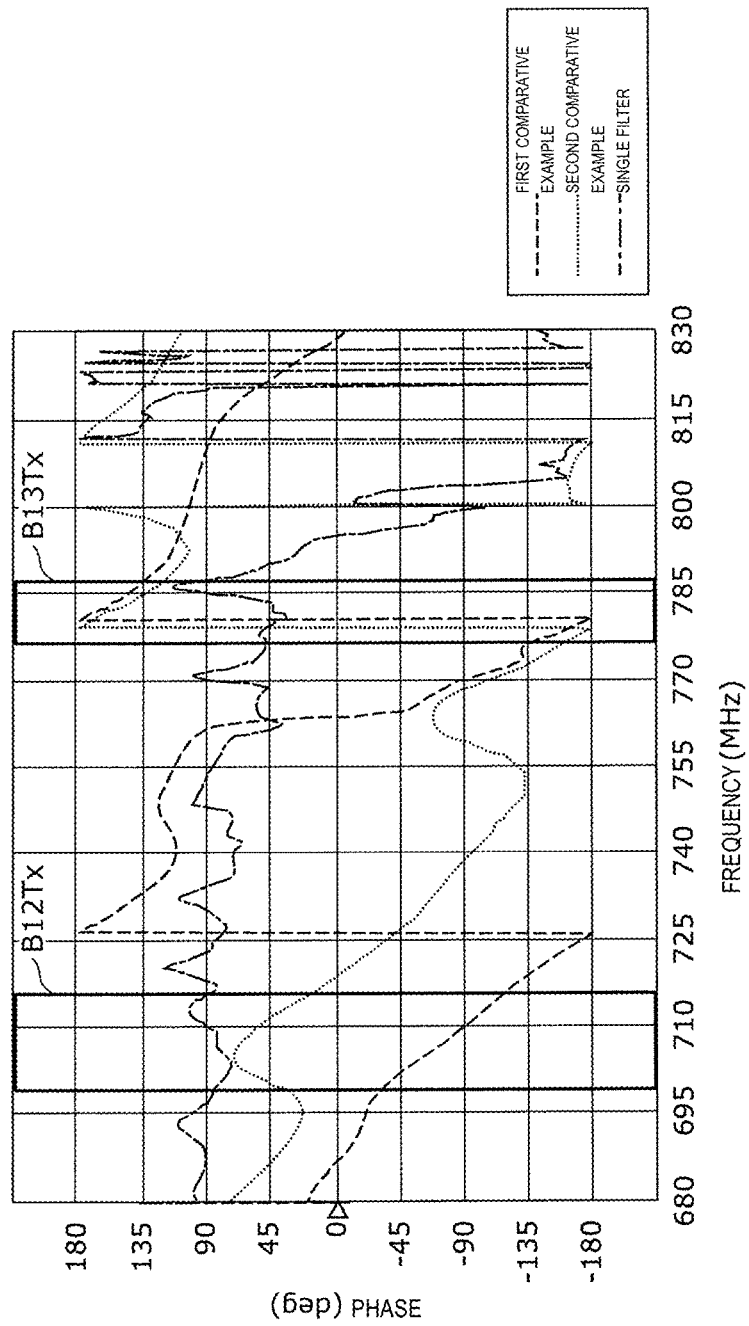
FIG. 6 is a graph showing the phase characteristics of a single additional circuit according to a first comparative example, those of a single additional circuit according to the second comparative example, and those of a single filter.

FIG. 6 is a graph showing the phase characteristics of the additional circuit according to the first comparative example, those of the additional circuit according to the second comparative example, and those of the filter 100. The phase characteristics of the additional circuit according to the first comparative example are indicated by a dashed line, the phase characteristics of the additional circuit 20 according to the second comparative example are indicated by a dotted line, and the phase characteristics of the filter 100 are indicated by a dot-dash line.

It is also assumed that each of the filter devices according to the first and second comparative examples is a filter that is included in a multiplexer in which three filters are connected in common to enable CA in which signals in a plurality of frequency bands corresponding to the three respective filters are simultaneously transmitted and received. The plurality of frequency bands corresponding to the three respective filters are, for example, B26Rx, B12Tx, and B13Tx of LTE. It is assumed that the passband of each of the filter devices according to the first and second comparative examples is B26Rx and that the passbands (that is, counterpart bands) of the other filters connected in common to the filter device according to the first comparative example or the second comparative example are B12Tx and B13Tx respectively.

In FIG. 6, portions surrounded by a thick solid line are the frequency bands corresponding to B12Tx and B13Tx. It is discovered that, in the first and second comparative examples, both in B12Tx and B13Tx, a band in which the phase difference between the additional circuit and the filter 100 is about 180 degrees is narrower than in the first preferred embodiment. That is, in the first and second comparative examples, the additional circuits have difficulty in generating a cancel signal having a phase opposite to the phase of an unwanted signal in each of the plurality of counterpart bands (B12Tx and B13Tx).

In the first comparative example, as indicated in Table 3, the average pitch of the plurality of electrode fingers of the longitudinally coupled resonator D1 and the average pitch of the plurality of electrode fingers of the longitudinally coupled resonator D2 are the same, and therefore, the resonant frequencies of the plurality of resonant modes are the same and it is difficult to make the phase difference between the additional circuit and the filter 100 close to about 180 degrees in both B12Tx and B13Tx. In the second comparative example, the additional circuit 20 includes only one longitudinally coupled resonator, and the longitudinally coupled resonator D1 does not include a plurality of IDT electrodes 120 or a plurality of IDT electrodes 130 as in a second preferred embodiment described below, and therefore, it is not possible to produce a plurality of resonant modes having different resonant frequencies. Accordingly, also in the second comparative example, it is difficult to make the phase difference between the additional circuit 20 and the filter 100 close to about 180 degrees in both B12Tx and B13Tx.

Now, advantageous effects produced by generating a cancel signal having a phase opposite to the phase of an unwanted signal in each of the counterpart bands (here, B12Tx and B13Tx) to cancel the unwanted signal are described with reference to FIG. 7 and Table 5 by comparing with the first and second comparative examples.

Figure 7:
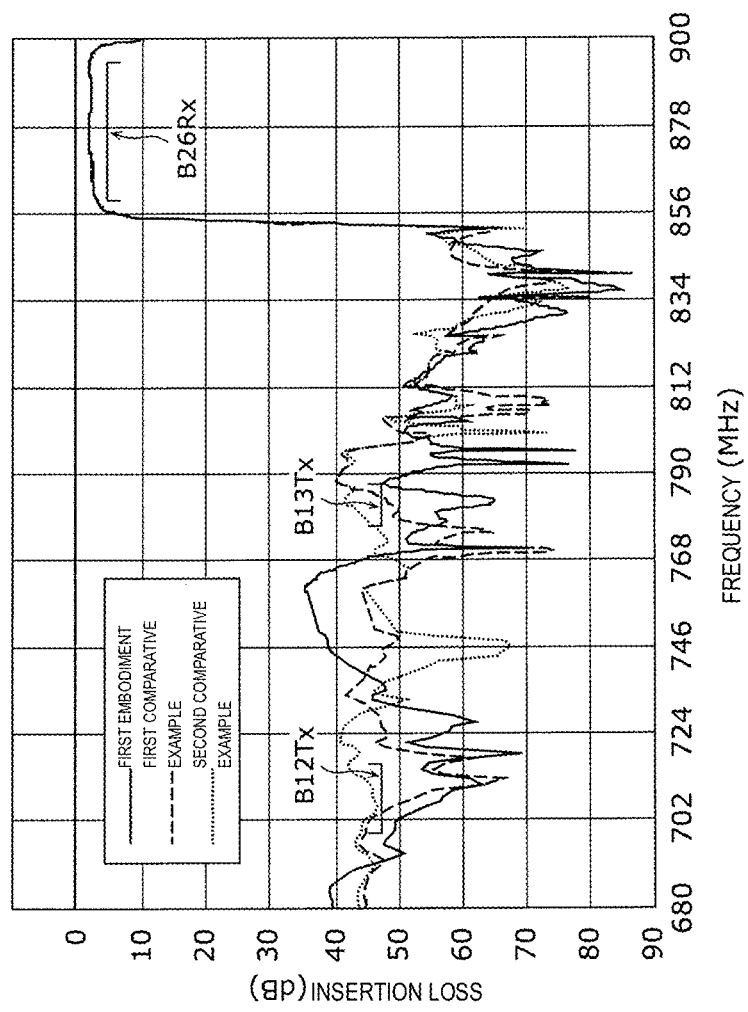
FIG. 7 is a graph in which the attenuation characteristics of the filter device according to the first preferred embodiment of the present invention, those of a filter device according to the first comparative example, and those of the filter device according to the second comparative example are compared.

FIG. 7 is a graph in which the attenuation characteristics of the filter device according to the first preferred embodiment, those of the filter device according to the first comparative example, and those of the filter device according to the second comparative example are compared. The attenuation characteristics of the filter device 1 according to the first preferred embodiment are indicated by a solid line, the attenuation characteristics of the filter device according to the first comparative example are indicated by a dashed line, and the attenuation characteristics of the filter device 2 according to the second comparative example are indicated by a dotted line. Table 5 indicates the attenuation of the filter device according to the first preferred embodiment, that of the filter device according to the first comparative example, and that of the filter device according to the second comparative example in B12Tx and B13Tx. Note that Table 5 indicates the minimum value of the attenuation in B12Tx and in B13Tx.

TABLE 5

|  | B12Tx Attenuation (dB) | B13Tx Attenuation (dB) |
|---|---|---|
| First preferred embodiment | 49.0 | 47.9 |
| First comparative example | 44.6 | 40.3 |
| Second comparative example | 44.0 | 41.0 |

As illustrated in FIG. 7, it is assumed that, for example, about 47 dB or more is required as the attenuation of the filter devices in B12Tx (about 699 MHz to about 716 MHz) and in B13Tx (about 777 MHz to about 787 MHz).

As illustrated in FIG. 7 and Table 5, in the first preferred embodiment, the minimum value of the attenuation in B12Tx is about 49.0 dB, the minimum value of the attenuation in B13Tx is about 47.9 dB, and the attenuation in B12Tx and that in B13Tx are greater than or equal to about 47 dB. This is because, as illustrated in FIG. 5, the additional circuit 10 generates a cancel signal having a phase opposite to the phase of an unwanted signal in each of B12Tx and B13Tx, and the unwanted signal in B12Tx and that in B13Tx are canceled.

Further, the number of the plurality of electrode fingers of the IDT electrode 120 on the input terminal 101 side is different between the longitudinally coupled resonator D1 and the longitudinally coupled resonator D2, and the number of the plurality of electrode fingers of the IDT electrode 130 on the output terminal 102 side is different between the longitudinally coupled resonator D1 and the longitudinally coupled resonator D2 to adjust the amplitude of a cancel signal so as to be the same or substantially the same as the amplitude of an unwanted signal. Note that the amplitude is adjusted by the capacitance element C1 to a large degree across a wide frequency band, and thereafter, the amplitude of a cancel signal is adjusted so as to be the same or substantially the same as the amplitude of an unwanted signal by an adjustment of the number of the plurality of electrode fingers. Such an adjustment for making the amplitude of a cancel signal the same or substantially the same as the amplitude of an unwanted signal contributes to an increase in the attenuation in B12Tx and B13Tx. If the amplitude of a cancel signal is smaller than the amplitude of an unwanted signal, the unwanted signal is not completely canceled. If the amplitude of a cancel signal is larger than the amplitude of an unwanted signal, the unwanted signal can be canceled but the cancel signal remains, and the cancel signal itself can become an unwanted signal.

On the other hand, as illustrated in FIG. 7 and Table 5, the minimum values of the attenuation in B12Tx in the first and second comparative examples are about 44.6 dB and about 44.0 dB, respectively, the minimum values of the attenuation in B13Tx in the first and second comparative examples are about 40.3 dB and about 41.0 dB, respectively, the minimum values are not greater than or equal to about 47 dB in B12Tx or in B13Tx, and the attenuation is not sufficient compared with the first preferred embodiment. This is because, as illustrated in FIG. 6, the additional circuits according to the first and second comparative examples fail to satisfactorily generate a cancel signal having a phase opposite to the phase of an unwanted signal in B12Tx and in B13Tx, and unwanted signals in B12Tx and B13Tx are not satisfactorily canceled.

As described above, when the average pitch of the plurality of electrode fingers is different between the longitudinally coupled resonator D1 and the longitudinally coupled resonator D2, the resonant frequencies of the plurality of resonant modes can be adjusted so as to be in different frequency bands, and a cancel signal having a phase opposite to the phase of an unwanted signal in each of the plurality of counterpart bands can be generated. Accordingly, unwanted signals in the plurality of counterpart bands can be canceled, that is, the attenuation characteristics can be improved in the plurality of counterpart bands, and the filter device 1 in which the attenuation characteristics can be effectively improved can be implemented.

Second Preferred Embodiment

Now, a second preferred embodiment of the present invention is described with reference to FIG. 8 to FIG. 12.

Configuration of Filter Device

Figure 8:
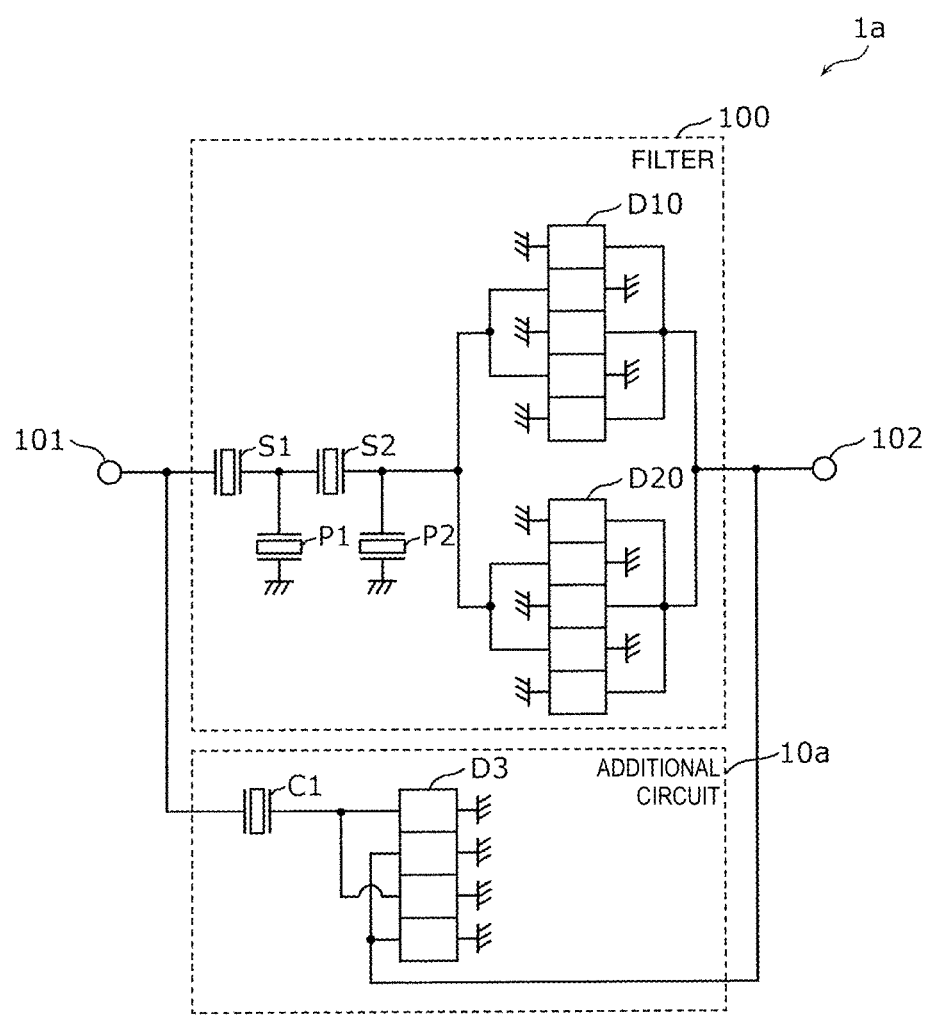
FIG. 8 is a configuration diagram illustrating an example of a filter device according to a second preferred embodiment of the present invention.

FIG. 8 is a configuration diagram illustrating an example of a filter device 1a according to the second preferred embodiment.

The filter device 1a according to the second preferred embodiment is different from the filter device 1 according to the first preferred embodiment in that the filter device 1a includes an additional circuit 10a, instead of the additional circuit 10. The remaining configuration is the same or substantially the same as those in the first preferred embodiment, and therefore, descriptions thereof are omitted and the difference is focused on and described.

The additional circuit 10a is connected in parallel with the filter 100 between the input terminal 101 and the output terminal 102. The additional circuit 10a generates a cancel signal that has a phase opposite to the phase of an unwanted signal, in each of the plurality of counterpart bands, leaking into the filter 100, and that is to cancel the unwanted signal as in the additional circuit 10.

The additional circuit 10a includes an IDT electrode group including a plurality of IDT electrodes that are arranged in the acoustic wave propagation direction as a configuration for generating a cancel signal. In the present preferred embodiment, the additional circuit 10a includes a longitudinally coupled resonator D3 as the IDT electrode group. Further, the additional circuit 10a includes one capacitance element C1 as at least one capacitance element provided between the longitudinally coupled resonator D3 and the input terminal 101 or one capacitance element provided between the longitudinally coupled resonator D3 and the output terminal 102. Note that the additional circuit 10a may include one capacitance element between the longitudinally coupled resonator D3 and the output terminal 102 or may include one capacitance element between the longitudinally coupled resonator D3 and the input terminal 101 and one capacitance element between the longitudinally coupled resonator D3 and the output terminal 102. Alternatively, the additional circuit 10a need not include the capacitance element C1. Note that in the present preferred embodiment, the IDT electrode group is, for example, a longitudinally coupled resonator that transmits a signal by using coupling of an acoustic wave. However, the IDT electrode group is not limited to this example and may be a transversal filter that transmits a signal by using propagation of an acoustic wave.

The longitudinally coupled resonator D3 adjusts the amplitude and phase of a signal input to the longitudinally coupled resonator D3 in order to generate a cancel signal having a phase opposite to the phase of and an amplitude the same or substantially the same as the amplitude of an unwanted signal in each of the plurality of counterpart bands. In the additional circuit 10a, the amplitude of a signal input to the capacitance element C1 is adjusted by the capacitance element C1 to a large degree across a wide frequency band, and thereafter, the amplitude and phase of the signal, in each of the plurality of counterpart bands, input to the longitudinally coupled resonator D3 are adjusted by the longitudinally coupled resonator D3 in order to cancel an unwanted signal in each of the plurality of counterpart bands.

Longitudinally Coupled Resonator in Additional Circuit

Now, the longitudinally coupled resonator D3 in the additional circuit 10a is described with reference to FIG. 9, FIG. 10, and Table 6.

Figure 9:
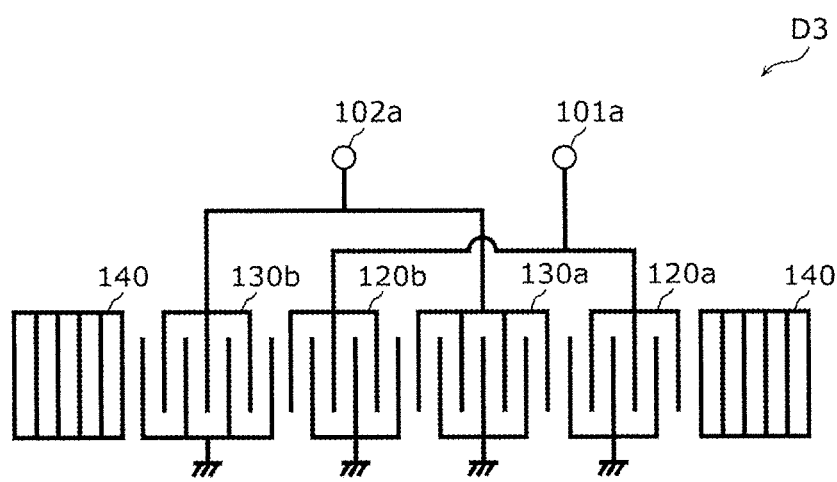
FIG. 9 is a schematic plan view of an example of a longitudinally coupled resonator according to the second preferred embodiment of the present invention.
Figure 10:
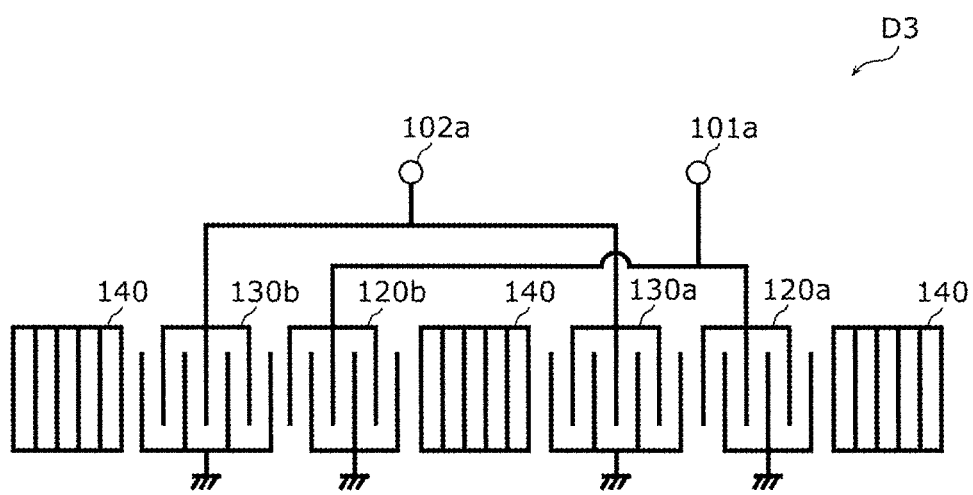
FIG. 10 is a schematic plan view of another example of the longitudinally coupled resonator according to the second preferred embodiment of the present invention.

FIG. 9 is a schematic plan view of an example of the longitudinally coupled resonator D3 according to the second preferred embodiment. FIG. 10 is a schematic plan view of another example of the longitudinally coupled resonator D3 according to the second preferred embodiment. Note that FIG. 9 and FIG. 10 schematically illustrate the longitudinally coupled resonator D3, and the number and the pitches of a plurality of electrode fingers of each of the plurality of IDT electrodes that define the longitudinally coupled resonator D3 in the second preferred embodiment are not limited to those as illustrated in FIG. 9 and FIG. 10.

The plurality of IDT electrodes that define the longitudinally coupled resonator D3 include at least two first IDT electrodes that are connected to the input terminal 101 and at least two second IDT electrodes that are connected to the output terminal 102. Here, preferably, the plurality of IDT electrodes that define the longitudinally coupled resonator D3 include two IDT electrodes 120a and 120b as the at least two first IDT electrodes and two IDT electrodes 130a and 130b as the at least two second IDT electrodes. Note that the plurality of IDT electrodes that define the longitudinally coupled resonator D3 may include three or more IDT electrodes as the at least two first IDT electrodes and three or more IDT electrodes as the at least two second IDT electrodes. The terminal 101a of the IDT electrodes 120a and 120b is connected to the input terminal 101 with the capacitance element C1 interposed therebetween, and the terminal 102a of the IDT electrodes 130a and 130b is connected to the output terminal 102.

The plurality of IDT electrodes that define the longitudinally coupled resonator D3 may include the reflectors 140 sandwiching the IDT electrodes 120a, 120b, 130a, and 130b in the propagation direction of an acoustic wave as illustrated in FIG. 9. Note that in a case where the additional circuit 10a includes a transversal filter as the IDT electrode group, a sound absorbing material may be provided, instead of the reflectors 140.

For example, in a case where the IDT electrodes 130a and 120b are spaced apart from each other and an acoustic wave is not coupled in the propagation direction accordingly, the IDT electrodes 120a, 120b, 130a, and 130b do not define one longitudinally coupled resonator D3, and the IDT electrodes 120a and 130a define one longitudinally coupled resonator and the IDT electrodes 120b and 130b define another longitudinally coupled resonator.

Note that the reflectors 140 need not be arranged such that all of the IDT electrodes 120a, 120b, 130a, and 130b in the longitudinally coupled resonator D3 are sandwiched by the pair of reflectors 140. For example, as illustrated in FIG. 10, a pair of reflectors 140 sandwich the IDT electrodes 120a and 130a in the propagation direction of an acoustic wave, and a pair of reflectors 140 sandwich the IDT electrodes 120b and 130b in the propagation direction of an acoustic wave. In this case, the reflector 140 is provided between the IDT electrodes 130a and 120b, and the IDT electrodes 130a and 120b are arranged in a positional relationship such that an acoustic wave is coupled in the propagation direction with the reflector 140 interposed therebetween. As described above, also in the case where the reflector 140 is provided between the IDT electrodes 130a and 120b, the longitudinally coupled resonator D3 can be regarded as one longitudinally coupled resonator.

As described above, when the additional circuit 10a is connected in parallel with the filter 100, an unwanted signal, in each of the plurality of counterpart bands, leaking into the filter 100 can be canceled. This is because a plurality of resonant modes can be produced in the additional circuit 10a. Specifically, this is because when the electrode parameters of the plurality of IDT electrodes that define the longitudinally coupled resonator D3 are adjusted, a plurality of resonant modes can be produced. At this time, the electrode parameters are adjusted such that the resonant frequencies of the plurality of resonant modes are in different frequency bands. Specifically, an adjustment is made such that the resonant frequency of one resonant mode becomes close to the center frequency of one counterpart band, and an adjustment is made such that the resonant frequency of another resonant mode becomes close to the center frequency of a counterpart band different from the one counterpart band. Accordingly, the additional circuit 10a can generate a cancel signal having a phase opposite to the phase of and an amplitude the same or substantially the same as the amplitude of an unwanted signal in each of the plurality of counterpart bands, and the unwanted signal in each of the plurality of counterpart bands can be canceled.

Now, the electrode parameters of the plurality of IDT electrodes that define the longitudinally coupled resonator D3 to cancel unwanted signals in the plurality of counterpart bands are described with reference to Table 6. Table 6 indicates the electrode parameters of the plurality of IDT electrodes that define the longitudinally coupled resonator D3.

TABLE 6

| Longitudinally coupled resonator D3 | Overlap width (μm) | Number of electrode fingers | Average pitch (μm) | Overall average pitch (μm) |
|---|---|---|---|---|
| IDT electrode 120a | 90.0 | 14 | 2.2543 | 2.3968 |
| IDT electrode 130a | | 14 | 2.4423 | |
| IDT electrode 120b | | 8 | 2.3466 | |
| IDT electrode 130b | | 10 | 2.5730 | |

The average pitch of the plurality of electrode fingers of the IDT electrode 120a is about 2.2543 μm, for example, the average pitch of the plurality of electrode fingers of the IDT electrode 120b is about 2.3466 μm, for example, and the average pitch of the plurality of electrode fingers of the IDT electrode 120a and the average pitch of the plurality of electrode fingers of the IDT electrode 120b are different from each other. The average pitch of the plurality of electrode fingers of the IDT electrode 130a is about 2.4423 μm, for example, the average pitch of the plurality of electrode fingers of the IDT electrode 130b is about 2.5730 μm, for example, and the average pitch of the plurality of electrode fingers of the IDT electrode 130a and the average pitch of the plurality of electrode fingers of the IDT electrode 130b are different from each other.

When the average pitch of the plurality of electrode fingers is different between the IDT electrodes 120a and 120b on the input terminal 101 side and the average pitch of the plurality of electrode fingers is different between the IDT electrodes 130a and 130b on the output terminal 102 side, a plurality of resonant modes can be produced. At this time, when the average pitch of the plurality of electrode fingers is adjusted, the resonant frequency of the resonant mode can be adjusted. That is, the resonant frequencies of the plurality of resonant modes can be adjusted so as to be in different frequency bands, and the additional circuit 10a can generate a cancel signal having a phase opposite to the phase of an unwanted signal in each of the plurality of counterpart bands.

The number of the plurality of electrode fingers of the IDT electrode 120a is 14, for example, the number of the plurality of electrode fingers of the IDT electrode 120b is 8, for example, and the number of the plurality of electrode fingers of the IDT electrode 120a and the number of the plurality of electrode fingers of the IDT electrode 120b are different from each other. The number of the plurality of electrode fingers of the IDT electrode 130a is 14, for example, the number of the plurality of electrode fingers of the IDT electrode 130b is 10, for example, and the number of the plurality of electrode fingers of the IDT electrode 130a and the number of the plurality of electrode fingers of the IDT electrode 130b are different from each other.

When the number of the plurality of electrode fingers is adjusted, the frequency bandwidth of the resonant mode can be adjusted. That is, when the number of the plurality of electrode fingers is different between the IDT electrodes 120a and 120b on the input terminal 101 side and the number of the plurality of electrode fingers is different between the IDT electrodes 130a and 130b on the output terminal 102 side, for each counterpart band, a frequency bandwidth in which a cancel signal has a phase opposite to the phase of an unwanted signal can be adjusted so as to match the bandwidth of the counterpart band. Further, when the number of the plurality of electrode fingers is adjusted, the amplitude characteristics of a cancel signal can be adjusted for each counterpart band. This is because when the numbers of the plurality of electrode fingers of the IDT electrodes 120a and 120b on the input terminal 101 side are adjusted, the input impedance that affects the amplitude can be adjusted, and when the numbers of the plurality of electrode fingers of the IDT electrodes 130a and 130b on the output terminal 102 side are adjusted, the output impedance that affects the amplitude can be adjusted. As described above, a frequency bandwidth in which a cancel signal has a phase opposite to the phase of an unwanted signal can be adjusted in accordance with the counter bandwidth, and the amplitude of the cancel signal in the frequency bandwidth can be adjusted in accordance with the amplitude of the unwanted signal. Accordingly, an optimum amplitude adjustment and an optimum phase adjustment can be made for each counterpart band, and advantageous effects of cancelation of unwanted signals can be increased.

Comparison with First and Second Comparative Examples

Advantageous effects produced by adjusting the electrode parameters of the plurality of IDT electrodes that define the longitudinally coupled resonator D3 as indicated in Table 6 are described by comparing with the first and second comparative examples.

The additional circuit 10a according to the second preferred embodiment can generate a cancel signal having a phase opposite to the phase of an unwanted signal in each of the plurality of counterpart bands, which is described with reference to FIG. 11.

Figure 11:
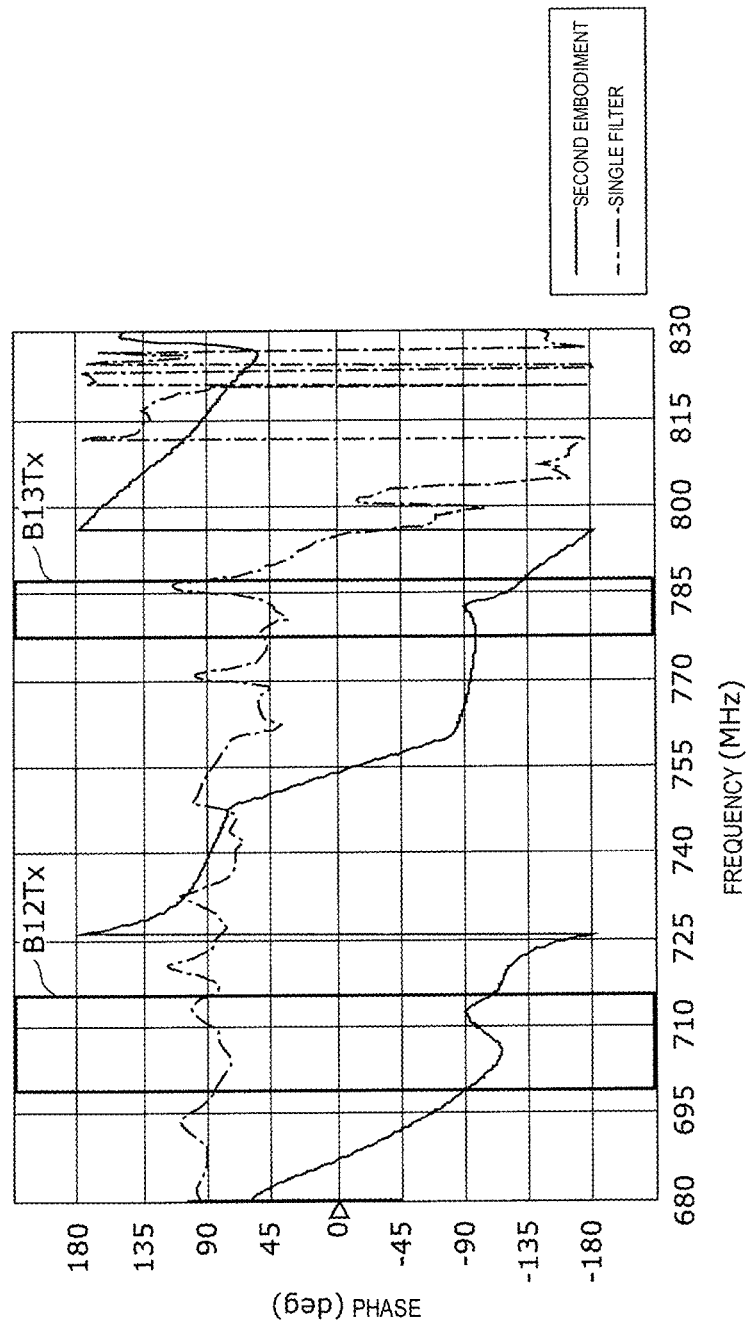
FIG. 11 is a graph showing the phase characteristics of a single additional circuit according to the second preferred embodiment of the present invention and those of a single filter.

FIG. 11 is a graph showing the phase characteristics of the additional circuit 10a according to the second preferred embodiment and those of the filter 100. The phase characteristics of the additional circuit 10a according to the second preferred embodiment are indicated by a solid line, and the phase characteristics of the filter 100 are indicated by a dot-dash line.

For example, it is assumed that the filter device 1a is a filter that is included in a multiplexer in which three filters are connected in common to enable CA in which signals in a plurality of frequency bands corresponding to the three respective filters are simultaneously transmitted and received. The plurality of frequency bands that correspond to the three respective filters are, for example, B26Rx (about 859 MHz to about 894 MHz), B12Tx (about 699 MHz to about 716 MHz), and B13Tx (about 777 MHz to about 787 MHz) of LTE. For example, it is assumed that the passband of the filter device 1a (filter 100) is B26Rx and that the passbands (that is, counterpart bands) of the other filters that are connected in common to the filter device 1a are B12Tx and B13Tx. In this case, focusing on the filter device 1a, it is necessary to improve the attenuation characteristics of the filter device 1a in frequency bands corresponding to B12Tx and B13Tx, which are the counterpart bands, so as to prevent transmission signals in B12Tx and B13Tx, which are the counterpart bands, from leaking into the filter device 1a. Accordingly, the additional circuit 10a needs to generate a cancel signal having a phase opposite to the phase of an unwanted signal in each of the plurality of counterpart bands (B12Tx and B13Tx).

In FIG. 11, portions surrounded by a thick solid line are the frequency bands corresponding to B12Tx and B13Tx. As shown in FIG. 11, in both B12Tx and B13Tx, the phase difference between the additional circuit 10a and the filter 100 is about 180 degrees. That is, the additional circuit 10a can generate a cancel signal having a phase opposite to the phase of an unwanted signal in each of the plurality of counterpart bands (B12Tx and B13Tx).

In the second preferred embodiment, as indicated in Table 6, when the average pitch of the plurality of electrode fingers is different between the IDT electrodes 120a and 120b on the input terminal 101 side and the average pitch of the plurality of electrode fingers is different between the IDT electrodes 130a and 130b on the output terminal 102 side, a plurality of resonant modes can be produced, and the resonant frequencies of the plurality of resonant modes can be adjusted so as to be in different frequency bands. Specifically, the resonant frequency of one resonant mode among the plurality of resonant modes can be set to approximately the center frequency of B12Tx, and the resonant frequency of the other resonant mode can be set to approximately the center frequency of B13Tx. Accordingly, the additional circuit 10a can generate a cancel signal having a phase opposite to the phase of an unwanted signal in each of the plurality of counterpart bands.

Further, in the second preferred embodiment, as indicated in Table 6, when the number of the plurality of electrode fingers is different between the IDT electrodes 120a and 120b on the input terminal 101 side and the number of the plurality of electrode fingers is different between the IDT electrodes 130a and 130b on the output terminal 102 side, a bandwidth in which the phase is opposite to the phase of an unwanted signal can be adjusted. Specifically, the phase difference is about 180 degrees across the bandwidth of B12Tx (about 699 MHz to about 716 MHz) and the phase difference is about 180 degrees across the bandwidth of B13Tx (about 777 MHz to about 787 MHz).

Now, advantageous effects produced by generating a cancel signal having a phase opposite to the phase of an unwanted signal in each of the counterpart bands (here, B12Tx and B13Tx) to cancel the unwanted signal are described with reference to FIG. 12 and Table 7 by comparing with the first and second comparative examples.

Figure 12:
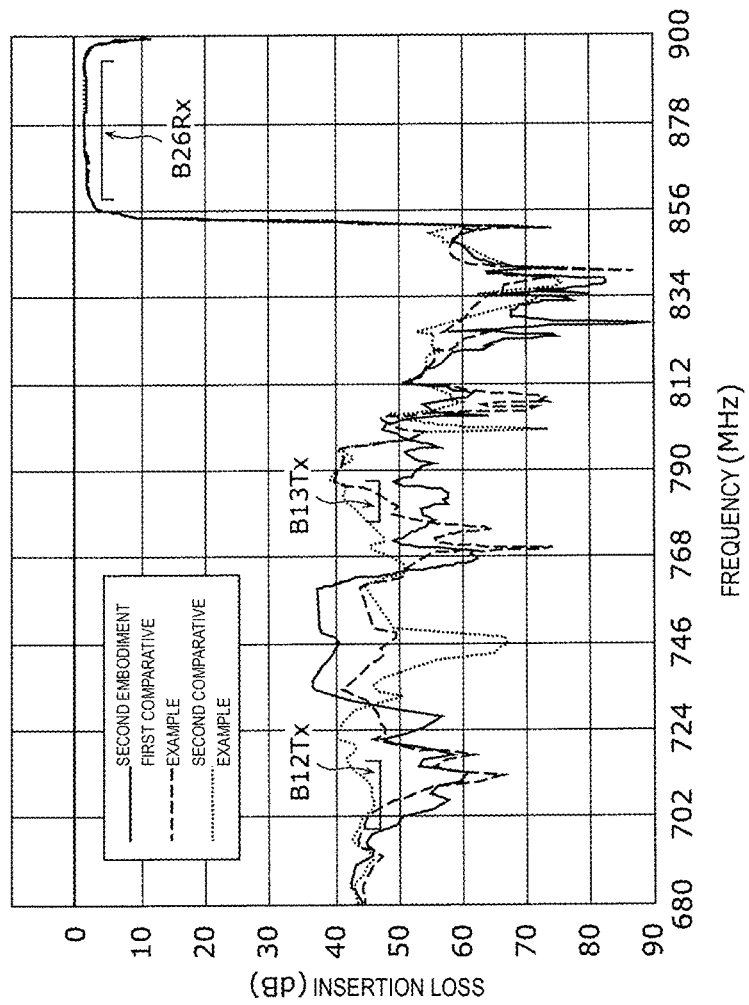
FIG. 12 is a graph in which the attenuation characteristics of the filter device according to the second preferred embodiment of the present invention, those of the filter device according to the first comparative example, and those of the filter device according to the second comparative example are compared.

FIG. 12 is a graph in which the attenuation characteristics of the filter device according to the second preferred embodiment, those of the filter device according to the first comparative example, and those of the filter device according to the second comparative example are compared. The attenuation characteristics of the filter device 1a according to the second preferred embodiment are indicated by a solid line, the attenuation characteristics of the filter device according to the first comparative example are indicated by a dashed line, and the attenuation characteristics of the filter device 2 according to the second comparative example are indicated by a dotted line. Table 7 indicates the attenuation of the filter device according to the second preferred embodiment, that of the filter device according to the first comparative example, and that of the filter device according to the second comparative example in B12Tx and B13Tx. Note that Table 7 indicates the minimum value of the attenuation in B12Tx and in B13Tx.

TABLE 7

|  | B12Tx Attenuation (dB) | B13Tx Attenuation (dB) |
|---|---|---|
| Second preferred embodiment | 48.3 | 49.3 |
| First comparative example | 44.6 | 40.3 |
| Second comparative example | 44.0 | 41.0 |

As illustrated in FIG. 12, it is assumed that, for example, about 47 dB or more is required as the attenuation of the filter devices in B12Tx (about 699 MHz to about 716 MHz) and in B13Tx (about 777 MHz to about 787 MHz).

As illustrated in FIG. 12 and Table 7, in the second preferred embodiment, the minimum value of the attenuation in B12Tx is about 48.3 dB, for example, the minimum value of the attenuation in B13Tx is about 49.3 dB, for example, and the attenuation in B12Tx and that in B13Tx are greater than or equal to about 47 dB. This is because, as illustrated in FIG. 11, the additional circuit 10a generates a cancel signal having a phase opposite to the phase of an unwanted signal in each of B12Tx and B13Tx, and the unwanted signal in B12Tx and that in B13Tx are canceled.

Further, the number of the plurality of electrode fingers is different between the IDT electrodes 120a and 120b on the input terminal 101 side, and the number of the plurality of electrode fingers is different between the IDT electrodes 130a and 130b on the output terminal 102 side to adjust the amplitude of a cancel signal so as to be the same or substantially the same as the amplitude of an unwanted signal. Note that the amplitude is adjusted by the capacitance element C1 to a large degree across a wide frequency band, and thereafter, the amplitude of a cancel signal is adjusted so as to be the same or substantially the same as the amplitude of an unwanted signal by an adjustment of the number of the plurality of electrode fingers. However, in a case where the amplitude of a cancel signal can be adjusted so as to be the same or substantially the same as the amplitude of an unwanted signal only by an adjustment of the number of the plurality of electrode fingers of each IDT electrode that defines the longitudinally coupled resonator D3, the capacitance element C1 is not necessary. In this case, the additional circuit 10a need not include the capacitance element C1.

As described above, such an adjustment to make the amplitude of a cancel signal the same or substantially the same as the amplitude of an unwanted signal as in the first preferred embodiment contributes to an increase in the attenuation in B12Tx and B13Tx.

On the other hand, as described in the first preferred embodiment, the attenuation is not sufficient in the first and second comparative examples compared with the second preferred embodiment.

As described above, when the average pitch of the plurality of electrode fingers is different between the IDT electrodes 120a and 120b on the input terminal 101 side and the average pitch of the plurality of electrode fingers is different between the IDT electrodes 130a and 130b on the output terminal 102 side, the resonant frequencies of the plurality of resonant modes can be adjusted so as to be in different frequency bands, and a cancel signal having a phase opposite to the phase of an unwanted signal in each of the plurality of counterpart bands can be generated. Accordingly, unwanted signals in the plurality of counterpart bands can be canceled, that is, the attenuation characteristics can be improved in the plurality of counterpart bands, and the filter device 1a in which the attenuation characteristics can be effectively improved can be implemented.

Third Preferred Embodiment

The filter devices according to the first and second preferred embodiments can be applied to a multiplexer. In a third preferred embodiment of the present invention, such a multiplexer is described. In the third preferred embodiment, for example, a multiplexer including the filter device 1 according to the first preferred embodiment is described.

Figure 13:
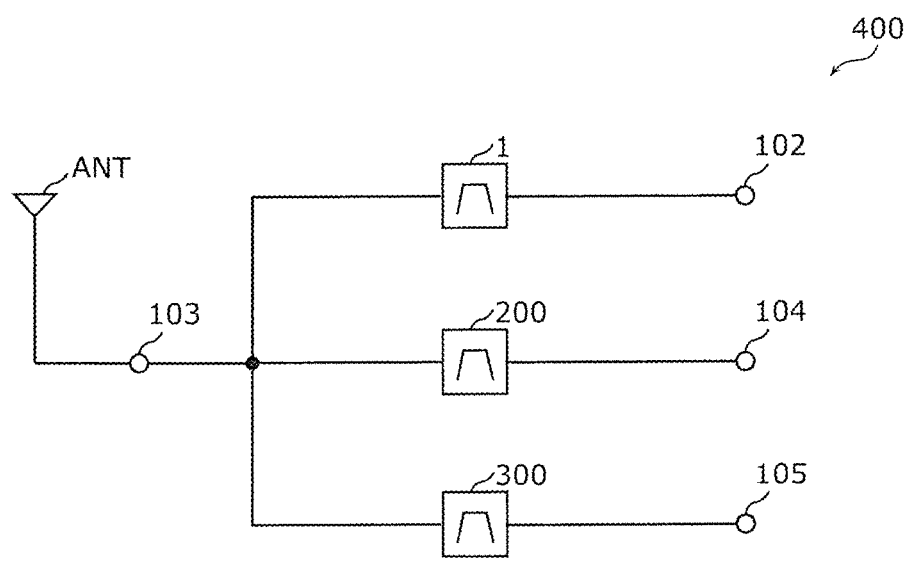
FIG. 13 is a configuration diagram illustrating an example of a multiplexer according to a third preferred embodiment of the present invention.

FIG. 13 is a configuration diagram illustrating an example of a multiplexer 400 according to the third preferred embodiment. FIG. 13 also illustrates an antenna element ANT that is connected to a common terminal 103 of the multiplexer 400. The antenna element ANT transmits and receives radio-frequency signals and is preferably, for example, a multiband-ready antenna that conforms to a communication standard, such as LTE.

The multiplexer 400 includes a plurality of filters including the filter device 1, and the input terminals or the output terminals of the plurality of filters are connected to the common terminal 103. The plurality of filters include at least three filters including the filter device 1, a second filter 200, and a third filter 300. In the present preferred embodiment, the multiplexer 400 is preferably a triplexer, for example, including three filters, namely, the filter device 1, the second filter 200, and the third filter 300, as the plurality of filters. In the present preferred embodiment, the input terminals of the plurality of filters are connected in common to the common terminal 103. However, the output terminals of the plurality of filters may be connected in common to the common terminal 103.

The common terminal 103 is provided in common for the filter device 1, the second filter 200, and the third filter 300. The common terminal 103 is connected to the antenna element ANT. That is, the common terminal 103 also defines and functions as an antenna terminal of the multiplexer 400.

The output terminal 102 of the filter device 1, an output terminal 104 of the second filter 200, and an output terminal 105 of the third filter 300 are connected to the RF signal processing circuit with, for example, the switch IC or the amplifier circuit interposed therebetween.

The additional circuit 10 in the filter device 1 is provided for two frequency bands. The passband of the second filter 200 and one frequency band among the two frequency bands at least partially overlap, and the passband of the third filter 300 and the other frequency band among the two frequency bands at least partially overlap. For example, the filter 100 in the filter device 1 is a filter having a passband that includes a band from about 859 MHz to about 894 MHz (B26Rx), the second filter 200 is a filter having a passband that includes a band from about 699 MHz to about 716 MHz (B12Tx), and the third filter 300 is a filter having a passband that includes a band from about 777 MHz to about 787 MHz (B13Tx). The additional circuit 10 is provided for, for example, B12Tx and B13Tx as the two frequency bands and generates cancel signals for canceling unwanted signals in B12Tx and B13Tx.

Accordingly, unwanted signals, in B12Tx and B13Tx, leaking from the second filter 200 and the third filter 300 to the filter device 1 can be canceled, and the attenuation characteristics of the filter device 1 in B12Tx and B13Tx can be improved. Therefore, the isolation characteristics among the filter device 1, the second filter 200, and the third filter 300 can be improved.

Note that the multiplexer 400 includes the filter device according to the first preferred embodiment. However, the multiplexer 400 may include the filter device 1a according to the second preferred embodiment, instead of the filter device 1.

The multiplexer 400 includes three filters as the plurality of filters. However, the multiplexer 400 may include four or more filters, for example. Even in a case where the number of filters connected in common increases in the multiplexer 400, the isolation characteristics among the filters can be improved with preferred embodiments of the present invention.

For example, in the additional circuit 10, when the number of longitudinally coupled resonators connected in parallel with each other is increased to three or more, and the average pitch of the plurality of electrode fingers of the plurality of IDT electrodes that define each of the longitudinally coupled resonators connected in parallel with each other is different among the longitudinally coupled resonators, the isolation characteristics among the filters can be improved.

Further, for example, in the additional circuit 10a, when the number of IDT electrodes on the input terminal 101 side and the number of IDT electrodes on the output terminal 102 side are increased to three or more, the average pitch of the plurality of electrode fingers of each of the IDT electrodes on the input terminal 101 side is different among the IDT electrodes, and the average pitch of the plurality of electrode fingers of each of the IDT electrodes on the output terminal 102 side is different among the IDT electrodes, the isolation characteristics among the filters can be improved.

The filter devices and the multiplexers according to preferred embodiments of the present invention have been described above. The present invention also includes other preferred embodiments provided by combining any elements in the above-described preferred embodiments, modifications obtained by making various modifications conceived by persons skilled in the art to the above-described preferred embodiments without departing from the spirit of the present invention, and various devices in which the filter devices or the multiplexer according to the present invention are built.

For example, in the first preferred embodiment described above, the number of the plurality of electrode fingers of the IDT electrode 120 in the longitudinally coupled resonator D1 and the number of the plurality of electrode fingers of the IDT electrode 120 in the longitudinally coupled resonator D2 are different from each other, but may be the same. Similarly, the number of the plurality of electrode fingers of the IDT electrode 130 in the longitudinally coupled resonator D1 and the number of the plurality of electrode fingers of the IDT electrode 130 in the longitudinally coupled resonator D2 are different from each other, but may be the same.

Further, for example, in the first preferred embodiment described above, the average pitch of the plurality of electrode fingers of the IDT electrode 120 in the longitudinally coupled resonator D1 and the average pitch of the plurality of electrode fingers of the IDT electrode 120 in the longitudinally coupled resonator D2 are different form each other, but may be the same. Similarly, the average pitch of the plurality of electrode fingers of the IDT electrode 130 in the longitudinally coupled resonator D1 and the average pitch of the plurality of electrode fingers of the IDT electrode 130 in the longitudinally coupled resonator D2 are different form each other, but may be the same. However, the overall average pitch of the plurality of electrode fingers of the plurality of IDT electrodes that define the longitudinally coupled resonator D1 and the overall average pitch of the plurality of electrode fingers of the plurality of IDT electrodes that define the longitudinally coupled resonator D2 need to be different from each other.

Further, for example, in the second preferred embodiment described above, the number of the plurality of electrode fingers of the IDT electrode 120a and the number of the plurality of electrode fingers of the IDT electrode 120b are different from each other, but may be the same. Similarly, the number of the plurality of electrode fingers of the IDT electrode 130a and the number of the plurality of electrode fingers of the IDT electrode 130b are different from each other, but may be the same.

Preferred embodiments of the present invention can be widely used in communication devices, such as mobile phones, for example, as a filter device and a multiplexer applicable to a multiband system.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
   a first filter between an input terminal and an output terminal; and
   an additional circuit connected in parallel with the first filter between the input terminal and the output terminal; wherein
   the additional circuit includes:
      at least two IDT electrode groups connected in parallel with each other and including a first IDT electrode group and a second IDT electrode group; and
      at least one capacitance element between the input terminal and the at least two IDT electrode groups or between the output terminal and the at least two IDT electrode groups;
   the at least two IDT electrode groups each include a plurality of IDT (Interdigital Transducer) electrodes that are arranged in an acoustic wave propagation direction;
   an average pitch of a plurality of electrode fingers of the plurality of IDT electrodes that define the first IDT electrode group and an average pitch of a plurality of electrode fingers of the plurality of IDT electrodes that define the second IDT electrode group are different from each other;
   the plurality of IDT electrodes that define the first IDT electrode group include at least one first IDT electrode connected to the input terminal and at least one second IDT electrode connected to the output terminal, and the plurality of IDT electrodes that define the second IDT electrode group include at least one first IDT electrode connected to the input terminal and at least one second IDT electrode connected to the output terminal;
   an average pitch of a plurality of electrode fingers of the at least one first IDT electrode in the first IDT electrode group and an average pitch of a plurality of electrode fingers of the at least one first IDT electrode in the second IDT electrode group are different from each other; and
   an average pitch of a plurality of electrode fingers of the at least one second IDT electrode in the first IDT electrode group and an average pitch of a plurality of electrode fingers of the at least one second IDT electrode in the second IDT electrode group are different from each other.

2. The filter device according to claim 1, wherein an overlap width of the plurality of electrode fingers of the IDT electrodes that define the first IDT electrode group and an overlap width of the plurality of electrode fingers of the IDT electrodes that define the second IDT electrode group are different from each other.

3. The filter device according to claim 1, wherein the first filter is a surface acoustic wave filter.

4. A multiplexer comprising:
   a plurality of filters including the filter device according to claim 1; wherein
   input terminals or output terminals of the plurality of filters are connected to a common terminal.

5. The multiplexer according to claim 4, wherein the plurality of filters include at least three filters including a filter device, a second filter, and a third filter.

6. The multiplexer according to claim 5, wherein
   the additional circuit in the filter device is provided for two frequency bands;
   a passband of the second filter and one frequency band among the two frequency bands at least partially overlap; and
   a passband of the third filter and another frequency band among the two frequency bands at least partially overlap.

7. The multiplexer according to claim 5, wherein
   the first filter has a passband including a band from about 859 MHz to about 894 MHz;
   the second filter has a passband including a band from about 699 MHz to about 716 MHz; and
   the third filter has a passband including a band from about 777 MHz to about 787 MHz.

8. The multiplexer according to claim 4, wherein
   a number of a plurality of electrode fingers of the at least one first IDT electrode in the first IDT electrode group and a number of a plurality of electrode fingers of the at least one first IDT electrode in the second IDT electrode group are different from each other; and
   a number of a plurality of electrode fingers of the at least one second IDT electrode in the first IDT electrode group and a number of a plurality of electrode fingers of the at least one second IDT electrode in the second IDT electrode group are different from each other.

9. The multiplexer according to claim 4, wherein an overlap width of the plurality of electrode fingers of the IDT electrodes that define the first IDT electrode group and an overlap width of the plurality of electrode fingers of the IDT electrodes that define the second IDT electrode group are different from each other.

10. A filter device comprising:
    a first filter between an input terminal and an output terminal; and
    an additional circuit connected in parallel with the first filter between the input terminal and the output terminal; wherein
    the additional circuit includes:
       at least two IDT electrode groups connected in parallel with each other and including a first IDT electrode group and a second IDT electrode group; and
       at least one capacitance element between the input terminal and the at least two IDT electrode groups or between the output terminal and the at least two IDT electrode groups;
    the at least two IDT electrode groups each include a plurality of IDT (Interdigital Transducer) electrodes that are arranged in an acoustic wave propagation direction;
    an average pitch of a plurality of electrode fingers of the plurality of IDT electrodes that define the first IDT electrode group and an average pitch of a plurality of electrode fingers of the plurality of IDT electrodes that define the second IDT electrode group are different from each other;
    the plurality of IDT electrodes that define the first IDT electrode group include at least one first IDT electrode connected to the input terminal and at least one second IDT electrode connected to the output terminal, and the plurality of IDT electrodes that define the second IDT electrode group include at least one first IDT electrode connected to the input terminal and at least one second IDT electrode connected to the output terminal;
a number of a plurality of electrode fingers of the at least one first IDT electrode in the first IDT electrode group and a number of a plurality of electrode fingers of the at least one first IDT electrode in the second IDT electrode group are different from each other; and
a number of a plurality of electrode fingers of the at least one second IDT electrode in the first IDT electrode group and a number of a plurality of electrode fingers of the at least one second IDT electrode in the second IDT electrode group are different from each other.

11. The filter device according to claim 10, wherein an overlap width of the plurality of electrode fingers of the IDT electrodes that define the first IDT electrode group and an overlap width of the plurality of electrode fingers of the IDT electrodes that define the second IDT electrode group are different from each other.

12. A multiplexer comprising:
a plurality of filters including the filter device according to claim 10; wherein
input terminals or output terminals of the plurality of filters are connected to a common terminal.

13. A filter device comprising:
a first filter between an input terminal and an output terminal; and
an additional circuit connected in parallel with the first filter between the input terminal and the output terminal; wherein
the additional circuit includes an IDT electrode group including a plurality of IDT electrodes that are arranged in an acoustic wave propagation direction;
the plurality of IDT electrodes that define the IDT electrode group include at least two first IDT electrodes that are connected to the input terminal and at least two second IDT electrodes that are connected the output terminal;
an average pitch of a plurality of electrode fingers of each of the at least two first IDT electrodes is different between the at least two first IDT electrodes; and
an average pitch of a plurality of electrode fingers of each of the at least two second IDT electrodes is different between the at least two second IDT electrodes.

14. The filter device according to claim 13, wherein
a number of the plurality of electrode fingers of each of the at least two first IDT electrodes is different between the at least two first IDT electrodes; and
a number of the plurality of electrode fingers of each of the at least two second IDT electrodes is different between the at least two second IDT electrodes.

15. The filter device according to claim 13, wherein the additional circuit further includes at least one capacitance element provided between the IDT electrode group and the input terminal or between the IDT electrode group and the output terminal.

16. The filter device according to claim 13, wherein the first filter is a surface acoustic wave filter.

17. A multiplexer comprising
a plurality of filters including the filter device according to claim 13; wherein
input terminals or output terminals of the plurality of filters are connected to a common terminal.

18. The multiplexer according to claim 17, wherein the plurality of filters include at least three filters including a filter device, a second filter, and a third filter.

19. The multiplexer according to claim 18, wherein
the additional circuit in the filter device is provided for two frequency bands;
a passband of the second filter and one frequency band among the two frequency bands at least partially overlap; and
a passband of the third filter and another frequency band among the two frequency bands at least partially overlap.

20. The multiplexer according to claim 18, wherein
the first filter has a passband including a band from about 859 MHz to about 894 MHz;
the second filter has a passband including a band from about 699 MHz to about 716 MHz; and
the third filter has a passband including a band from about 777 MHz to about 787 MHz.

* * * * *